(12) United States Patent
Bauser

(10) Patent No.: US 7,355,916 B2
(45) Date of Patent: Apr. 8, 2008

(54) METHOD AND CIRCUITRY TO GENERATE A REFERENCE CURRENT FOR READING A MEMORY CELL, AND DEVICE IMPLEMENTING SAME

(75) Inventor: Philippe Bauser, Sauverny (FR)

(73) Assignee: Innovative Silicon S.A., Lausanne (CH)

( * ) Notice: Subject to any disclaimer, the term of this patent is extended or adjusted under 35 U.S.C. 154(b) by 0 days.

(21) Appl. No.: 11/515,667

(22) Filed: Sep. 5, 2006

(65) Prior Publication Data

US 2007/0064489 A1 Mar. 22, 2007

Related U.S. Application Data

(60) Provisional application No. 60/718,417, filed on Sep. 19, 2005.

(51) Int. Cl.
*G11C 7/00* (2006.01)

(52) U.S. Cl. .................. 365/210; 365/225.7

(58) Field of Classification Search ............. 365/210, 365/225.7; 327/543
See application file for complete search history.

(56) References Cited

U.S. PATENT DOCUMENTS

| | | |
|---|---|---|
| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,791,610 A | 12/1988 | Takemae |
| 4,979,014 A | 12/1990 | Hieda et al. |
| 5,144,390 A | 9/1992 | Matloubian |
| 5,258,635 A | 11/1993 | Nitayama et al. |
| 5,388,068 A | 2/1995 | Ghoshal et al. |
| 5,446,299 A | 8/1995 | Acovic et al. |
| 5,448,513 A | 9/1995 | Hu et al. |

(Continued)

FOREIGN PATENT DOCUMENTS

EP 0 030 856 6/1981

(Continued)

OTHER PUBLICATIONS

"Low-Voltage Transient Bipolar Effect Induced by Dynamic Floating-Body Charging in PD/SOI MOSFETs", Pelella et al., Final Camera Ready Art, SOI Conference, Oct. 1995, 2 pages.

(Continued)

*Primary Examiner*—Son Dinh
(74) *Attorney, Agent, or Firm*—Neil A. Steinberg

(57) ABSTRACT

There are many inventions disclosed herein. In one aspect, the present inventions are directed to methods and circuitry to control, adjust, determine and/or modify the absolute and/or relative positioning or location (i.e., absolute or relative amount) of reference current which is employed by sensing circuitry to sense the data state of a memory cell during a read operation of one or more memory cells. The control, adjustment, determination and/or modification of the reference current levels may be implemented using many different, distinct and/or diverse techniques and circuitry, including both analog and digital techniques and circuitry.

34 Claims, 24 Drawing Sheets

U.S. PATENT DOCUMENTS

| | | |
|---|---|---|
| 5,466,625 A | 11/1995 | Hsieh et al. |
| 5,489,792 A | 2/1996 | Hu et al. |
| 5,528,062 A | 6/1996 | Hsieh et al. |
| 5,568,356 A | 10/1996 | Schwartz |
| 5,593,912 A | 1/1997 | Rajeevakumar |
| 5,606,188 A | 2/1997 | Bronner et al. |
| 5,627,092 A | 5/1997 | Alsmeier et al. |
| 5,631,186 A | 5/1997 | Park et al. |
| 5,696,718 A | 12/1997 | Hartmann |
| 5,740,099 A | 4/1998 | Tanigawa |
| 5,778,243 A | 7/1998 | Aipperspach et al. |
| 5,780,906 A | 7/1998 | Wu et al. |
| 5,784,311 A | 7/1998 | Assaderaghi et al. |
| 5,811,283 A | 9/1998 | Sun |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 6,018,172 A | 1/2000 | Hidada et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,556,477 B2 | 4/2003 | Hsu et al. |
| 6,566,177 B1 | 5/2003 | Radens et al. |
| 6,567,330 B2 | 5/2003 | Fujita et al. |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,912,150 B2 | 6/2005 | Portmann et al. |
| 7,061,806 B2 | 6/2006 | Tang et al. |
| 7,071,771 B2 * | 7/2006 | Takano et al. ............... 327/543 |
| 7,085,156 B2 | 8/2006 | Ferrant et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146488 A1 | 8/2003 | Nagano et al. |
| 2003/0151112 A1 | 8/2003 | Yamada et al. |
| 2003/0156457 A1 | 8/2003 | Ooishi |
| 2003/0185037 A1 | 10/2003 | Hibino |
| 2004/0108532 A1 | 6/2004 | Forbes |
| 2005/0017240 A1 | 1/2005 | Fazan |
| 2005/0063224 A1 | 3/2005 | Fazan et al. |
| 2005/0169038 A1 | 8/2005 | Inoue et al. |
| 2005/0226070 A1 | 10/2005 | Ohsawa |
| 2005/0232043 A1 | 10/2005 | Ohsawa |
| 2006/0091462 A1 | 5/2006 | Okhonin et al. |
| 2006/0092689 A1 * | 5/2006 | Braun et al. ................. 365/158 |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2007/0023833 A1 | 2/2007 | Okhonin et al. |
| 2007/0058427 A1 | 3/2007 | Okhonin et al. |

FOREIGN PATENT DOCUMENTS

| | | |
|---|---|---|
| EP | 0 350 057 | 1/1990 |
| EP | 0 354 348 | 2/1990 |
| EP | 0 362 961 | 4/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 642 173 | 3/1995 |
| EP | 0 366 882 | 5/1995 |
| EP | 0 465 961 | 8/1995 |

| | | |
|---|---|---|
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 689 252 | 8/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| EP | 1 560 221 | 8/2005 |
| FR | 2 197 494 | 3/1974 |
| GB | 1 414 228 | 11/1975 |
| JP | 62-272561 | 11/1987 |
| JP | 02-294076 | 2/1991 |
| JP | 03171768 | 7/1991 |
| JP | 08213624 | 8/1996 |
| JP | 8-274277 | 10/1996 |
| JP | 09046688 | 2/1997 |
| JP | 9-82912 | 3/1997 |
| JP | 10242470 | 11/1998 |
| JP | 11-87649 | 3/1999 |
| JP | 247735 | 8/2000 |
| JP | 274221 | 9/2000 |
| JP | 389106 | 12/2000 |
| JP | 180633 | 6/2001 |
| JP | 2002-94027 | 3/2002 |
| JP | 2002-176154 | 6/2002 |
| JP | 2002-246571 | 8/2002 |
| JP | 2002-0981 | 11/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"Floating-Body Concerns for SOI Dynamic Random Access Memory (DRAM)", Mandelman et al, Proceedings 1996 IEEE International SOI Conference, Oct. 1996, pp. 136-137.

"A Capacitorless Double-Gate DRAM Cell", Kuo et al., IEEE Electron Device Letters, vol. 23, No. 6, Jun. 2002, pp. 345-347.

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No. 5, May 1990, pp. 1373-1382.

"Mechanisms of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's". Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI FLASH Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21st International Conference on Microelectronics (MIEL '97), vol. 1, NIS, Yugoslavis, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lonc̆ar et al., IEEE Proc. 22nd International Conference on Microelectronics (MIEL 2000), vol. 2, NIŠ, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15 μm SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depths Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Papers (IEEE Cat No. 97TH8303), pp. 339-342.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

Hot-Carrier Effect in Ultra-Thin-Film (UTF) Fully-Depleted SOI MOSFET's, Yu et al., 54th Annual Device Research Conference Digest (Cat. No. 96TH8193), pp. 22-23.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE IEDM, 1994, pp. 809-812.

"A Dynamic Threshold Voltage MOSFET (DTMOS) for Very Low Voltage Operation", Assaderaghi et al., IEEE Electron Device Letters, vol. 15, No. 12, Dec. 1994, pp. 510-512.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ -Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

dRAM Design Using the Taper-Isolated Dynamic RAM Cell, Leiss et al., IEEE Transactions on Electron Devices, vol. ED-29, No. 4, Apr. 1982, pp. 707-714.

"Fully Isolated Lateral Bipolar-MOS Transistors Fabricated in Zone-Melting-Recrystallized Si Films on SiO2", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Wei nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capactor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless 1T-DRAM: From Single-gate PD-SOI to Double-gate FINDRAM", Tanaka et al., 2004 IEEE, 4 pages.

"A Design of a Capacitorless 1-T-DRAM Cell Using Gate-induced Drain Leakage (GIDL) Current for Low-Power and High-speed Embedded Memory", Yoshida et al., 2003 IEEE, 4 pages.

"A Study of High Scalable DG-FinDRAM", Yoshida et al., IEEE Electron Device Letters, vol. 26, No. 9, Sep. 2005, pp. 655-657.

"Novel Capacitorless 1T-DRAM From Single-gate PD-SOI to Double-gate FinDRAM", ATIP Scoops, May 9, 2005, 9 pages.

"A High-Speed Clamped Bit-Line Current-Mode Sense Amplifier", T. Blalock, IEEE Journal of Solid-State Circuits, vol. 26, No. 4, Apr. 1991, pp. 542-548.

* cited by examiner

METHOD AND CIRCUITRY TO GENERATE A REFERENCE CURRENT FOR READING A MEMORY CELL, AND DEVICE IMPLEMENTING SAME

RELATED APPLICATION

This application claims priority to U.S. Provisional Application Ser. No. 60/718,417, entitled "Method and Circuitry to Generate a Reference Current for Reading a Memory Cell Having an Electrically Floating Body Transistor, and Device Implementing Same", filed Sep. 19, 2005. The contents of this provisional application are incorporated by reference herein in their entirety.

BACKGROUND

The inventions relate to a semiconductor memory cell, array, architecture and device, and techniques for controlling and/or operating such cell, array and device; and more particularly, in one aspect, to a dynamic random access memory ("DRAM") cell, array, architecture and device, wherein the memory cell includes an electrically floating body wherein an electrical charge is stored therein.

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and Fin-FET.

One type of dynamic random access memory cell is based on, among other things, the electrically floating body effect of SOI transistors. (See, for example, U.S. Pat. No. 6,969, 662). In this regard, the dynamic random access memory cell may consist of a PD or a FD SOI transistor (or transistor formed in bulk material/substrate) on having a channel, which is disposed adjacent to the body and separated therefrom by a gate dielectric. The body region of the transistor is electrically floating in view of the insulation layer (or non-conductive region, for example, in a bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the '662 patent, including, for example, the features, attributes, architectures, configurations, materials, techniques and advantages described and illustrated therein, are incorporated by reference herein.

The memory cell 12 of DRAM array 10 operates by accumulating in or emitting/ejecting majority carriers (electrons or holes) 34 from body region 18. (See, for example, the N-channel transistor in FIGS. 2A and 2B). In this regard, conventional write techniques may accumulate majority carriers (in this example, "holes") 34 in body region 18 of memory cells 12 by, for example, impact ionization near source region 20 and/or drain region 22. (See, FIG. 2A). The majority carriers 30 may be emitted or ejected from body region 18 by, for example, forward biasing the source/body junction and/or the drain/body junction. (See, FIG. 2B).

Notably, for at least the purposes of this discussion, logic high or logic "1" corresponds to, for example, an increased concentration of majority carries in the body region relative to an unprogrammed device and/or a device that is programmed with logic low or logic "0". In contrast, logic low or logic "0" corresponds to, for example, a reduced concentration of majority carries in the body region relative to an unprogrammed device and/or a device that is programmed with logic high or logic "1".

Conventional reading is often performed by applying a small drain bias and a gate bias above the transistor threshold voltage. A sense amplifier senses, detects and/or samples the drain current which is determined or influenced by the charge stored in the electrically floating body of the transistor of the memory cell thereby giving a possibility to distinguish between the data states (for example, state "1" and state "0"). A floating body memory device may have two different current "states" corresponding to the two different logical states "1" and "0".

Notably, when the difference in electrical characteristic between two states is small and/or variable, a tracking reference may be employed for correct recovery of the stored digital data during a read operation. In this regard, a midpoint reference is often used so as to position the reference halfway between the characteristics of two adjacent digital states. This midpoint reference is classically constructed using two memory cells storing the two adjacent digital states. For instance, in a dynamic random access memory (DRAM) making use of Silicon-On-Insulator (SOI) floating body memory cells, a cell storing state "0" and a cell storing state "1" are placed in parallel and biased appropriately such as to provide a sum of the two corresponding currents. This term is then divided by two to generate a midpoint reference level used to discriminate the state of a read memory cell inside the array. (See, FIG. 3).

However, unavoidable variations typically exist in commercial devices because of mismatch in memory cell characteristics as well as mismatch in the transistors that comprise the circuitry (for example, the sense amplifier circuitry) which is responsible for sensing, sampling, detecting and/or discriminating between the data states. This tends to reduce the margin of operation (for example, the read window margin). To minimize this issue, a common practice is the use of a plurality of reference cells in parallel, thus decreasing the overall variance of the reference characteristic. (See, FIG. 3).

Notably, the concerns regarding mismatch are often exacerbated when implementing deep sub-micron technologies. It has been reported that the variance of an electrical characteristic increases with the absolute value of the electrical characteristic (although diminishing in relative terms). (See for example: "Understanding MOSFET Mismatch for Analog Design" by Drennan et al., IEEE J. Solid-State Circuits, vol. 38, pp. 450-456, March 2003). As a result, the variance of the various electrical characteristics corresponding to the different digital states may not be constant. With that in mind, in relation to the SOI floating body DRAM example, these current corresponding to a read operation of the memory cells storing state "1", the reference, and state "0" affected by their respective variance and measured at the sense amplifier level are depicted in FIG. 4. Prior art midpoint reference positioning may also exhibit the drawback of having unequal read margins toward state "0" and state "1", this latter case demonstrates a lower margin. This lower margin may eventually translate into more failures during the read operations (and/or an overall reduction in the read window margin).

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In one aspect, the present inventions are directed to an integrated circuit device (for example, logic or discrete memory device) including a reference current generation circuit to generate a reference current for data sensing circuitry. In one embodiment, the reference current generation circuit comprises a plurality of reference networks, wherein each reference network includes a current driver, including a transistor having an output which is coupled to a signal line, and a reference cell network. The reference cell network includes a plurality of reference cells, and wherein each reference cell is programmed to one of a plurality of data states (for example, via storing one of the plurality of data states in an electrically floating body region of a transistor). In this embodiment, (i) a majority of the reference cells of at least one of the reference cell networks are programmed to a second data state and (ii) a minority of the reference cells of the at least one of the reference cell network is/are programmed to a first data state. In addition, an equal number of the reference cells of at least one of the reference cell networks are programmed to a first data state and to a second data state. The reference current generation circuit also includes a reference current driver including a transistor which is coupled to the plurality of reference networks via the signal line to generate the reference current.

In one embodiment, a majority of the reference cells of a plurality of the reference cell networks are programmed to the second data state and a minority of the reference cells of the at least one of the reference cell network is/are programmed to the first data state. In another embodiment, all of the reference cells of the at least one reference cell network are programmed to the second data state.

The reference current generation circuit may also include control data signal lines, coupled to the at least one reference cell network, to program the reference cells of the at least one reference cell network. A memory circuitry (for example, one or more registers and/or fuses or anti-fuses), coupled to the control data signal lines, may store control data which is applied to the control data signal lines to program the reference cells of the at least one reference cell network. The reference current generation circuit may include control circuitry, coupled to the control data signal lines, to determine the control data which is applied to the control data signal lines to program the reference cells of the at least one reference cell network.

In one embodiment, the control data may be fixed. In another embodiment, the control data may be applied to the control data signal lines to program the reference cells of the at least one reference cell network during start-up and/or initialization and/or operation.

In one embodiment, the device geometry of the transistor of the current driver is more than twice the geometry device of the transistor of the reference current driver. In one embodiment, the device geometry of the transistor of each current driver is at least substantially the same. In another embodiment, the device geometry of the transistor of the current driver of at least one reference network is substantially different from a device geometry of the transistor of the current driver of each of a plurality of the reference networks.

In another aspect, the present inventions are directed to an integrated circuit device (for example, logic or discrete memory device) including a reference current generation circuit to generate a reference current for data sensing circuitry, the reference current generation circuit includes a plurality of reference networks and a reference current driver coupled to the plurality of reference networks via a signal line to generate the reference current. In this aspect of the present inventions, each reference network includes: (i) a current driver having an output coupled to the signal line, and (ii) a reference cell network wherein the reference cell network includes a plurality of reference cells. Further, in this aspect of the present inventions, each reference cell is programmed in (i) a first data state which corresponds to a first charge in the body region of the transistor of the reference cell, or (ii) a second data state which corresponds to a second charge in the body region of the transistor of the reference cell. Moreover, a majority of the reference cells of at least one of the reference cell networks are programmed to a second data state and a minority of the reference cells of the at least one of the reference cell network is/are programmed to a first data state. In addition, an equal number of the reference cells of at least one of the reference cell networks are programmed to a first data state and to a second data state.

In one embodiment, a majority of the reference cells of a plurality of the reference cell networks are programmed to the second data state and a minority of the reference cells of the at least one of the reference cell network is/are programmed to the first data state. In another embodiment, all of the reference cells of the at least one reference cell network are programmed to the second data state.

The reference current generation circuit may also include control data signal lines, coupled to the at least one reference cell network, to program the reference cells of the at least one reference cell network. A memory circuitry (for example, one or more registers and/or fuses or anti-fuses), coupled to the control data signal lines, may store control data which is applied to the control data signal lines to program the reference cells of the at least one reference cell network. The reference current generation circuit may include control circuitry, coupled to the control data signal lines, to determine the control data which is applied to the control data signal lines to program the reference cells of the at least one reference cell network.

In one embodiment, the control data is fixed. The control data may be applied to the control data signal lines to program the reference cells of the at least one reference cell network during start-up and/or initialization and/or operation.

In one embodiment, the device geometry of the transistor of the current driver is more than twice the geometry device of the transistor of the reference current driver. In another embodiment, the device geometry of the transistor of each current driver is at least substantially the same. In yet another embodiment, the device geometry of the transistor of the current driver of at least one reference network is substantially different from a device geometry of the transistor of the current driver of each of a plurality of the reference networks.

In yet another aspect, the present inventions are directed to an integrated circuit device (for example, logic or discrete memory device) including a reference current generation circuit to generate a reference current for data sensing circuitry, the reference current generation circuit including a plurality of reference networks, wherein each reference network includes a current driver including a transistor having an output which is coupled to a signal line and a reference cell network. The reference cell network, in this aspect of the invention, includes a plurality of reference cells, and wherein each reference cell is programmed to one of a plurality of data states and includes a transistor having an electrically floating body region. Each transistor of each reference cell is programmed in (i) a first data state which corresponds to a first charge in the body region of the transistor of the reference cell, or (ii) a second data state which corresponds to a second charge in the body region of the transistor of the reference cell. Further, each transistor of a majority of the reference cells of at least one of the reference cell networks is programmed to the second data state and each transistor of a minority of the reference cells of the at least one of the reference cell network is/are programmed to the first data state. The reference current generation circuit further includes a reference current driver including a transistor which is coupled to the plurality of reference networks via the signal line to generate the reference current for the data sensing circuitry.

In one embodiment, the transistors of an equal number of the reference cells of a plurality of reference cell networks are programmed to a first data state and to a second data state. In another embodiment, the transistors of all of the reference cells of the at least one reference cell network are programmed to a second data state.

The reference current generation circuit may further include memory circuitry may store control data which is applied to at least one reference cell network to program the transistor of each reference cell of at least one reference cell network. Indeed, the reference current generation circuit may include control circuitry to determine the control data which is applied to at least one reference cell network to program the transistor of each reference cell of at least one reference cell network.

In one embodiment, the control data is fixed. The control data may be applied to the control data signal lines to program the reference cells of the at least one reference cell network during start-up and/or initialization and/or operation. Indeed, the data state of the transistor of each reference cell of the plurality of reference cell networks may be fixed.

In one embodiment, the device geometry of the transistor of the current driver is more than twice the geometry device of the transistor of the reference current driver. In another embodiment, the device geometry of the transistor of each current driver is at least substantially the same. In yet another embodiment, the device geometry of the transistor of the current driver of at least one reference network is substantially different from a device geometry of the transistor of the current driver of each of a plurality of the reference networks.

In another aspect, the present inventions are directed to a reference current generation circuit to generate a reference current for data sensing circuitry disposed on an integrated circuit device (for example, logic or discrete memory device). The reference current generation circuit of this aspect of the inventions includes a plurality of reference networks, wherein each reference network includes (i) a current driver including a transistor having an output which is coupled to a signal line, wherein the transistor of each current driver includes a device geometry and (ii) a reference cell network wherein the reference cell network includes a plurality of reference cells. The reference cells are programmed to one of a plurality of data states and each include a transistor having an electrically floating body region wherein each transistor is programmed in (i) a first data state which corresponds to a first charge in the body region of the transistor of the reference cell, or (ii) a second data state which corresponds to a second charge in the body region of the transistor of the reference cell. The reference current generation circuitry further includes a reference current driver including a transistor which is coupled to the plurality of reference networks via the signal line to generate the reference current for the data sensing circuitry. In this aspect of the present inventions, the device geometry of the transistor of each current driver is more than twice the geometry device of the transistor of the reference current driver.

In one embodiment, the transistor of each current driver of each reference network includes a device geometry which is at least substantially the same.

In another embodiment, each transistor of a majority of the reference cells of at least one of the reference cell networks is programmed to the second data state and each transistor of a minority of the reference cells of the at least one of the reference cell network is/are programmed to the first data state. Indeed, in another embodiment, an equal number of the transistors of the reference cells of the reference cell networks are programmed to a first data state and to a second data state.

Notably, the present inventions may be implemented in conjunction with any memory cell technology, whether now known or later developed. For example, the memory cells may include one or more electrically floating body transistors, one transistor-one capacitor architecture, electrically floating gate transistors, junction field effect transistors (often referred to as JFETs), or any other memory/transistor technology whether now known or later developed. All such memory technologies are intended to fall within the scope of the present inventions.

Further, the present inventions may be implemented in conjunction with any type of memory (including discrete or integrated with logic devices), whether now known or later developed. For example, the memory may be a DRAM, SRAM and/or Flash. All such memory types are intended to fall within the scope of the present inventions.

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many other embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the Detailed Description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIGS. 12A and 12B are schematic block diagram illustrations of exemplary integrated circuit devices in which the memory cell array (and certain peripheral circuitry) may be implemented, according to certain aspects of the present inventions, wherein FIG. 12A is a logic device (having logic circuitry and resident memory) and FIG. 12B is a memory device (having primarily of a memory array);

DETAILED DESCRIPTION

There are many inventions described and illustrated herein. In one aspect the present inventions are directed to techniques for reading, controlling and/or operating a memory cell, array, architecture and/or integrated circuit device wherein the memory cell(s) include electrically floating body transistors in which an electrical charge is stored in the body of the transistor. The present inventions are also directed to memory cell, array, architecture and device that implement circuitry to implement such reading, controlling and/or operating techniques. Notably, the memory cell and/or memory cell array may comprise a portion of an integrated circuit device, for example, logic device (such as, a microcontroller or microprocessor) or a portion of a memory device (such as, a discrete memory).

In one aspect, the present inventions control, adjust, determine and/or modify the absolute and/or relative positioning or location (i.e., the absolute or relative amount) of the reference current which is employed by sensing circuitry during a read operation of one or more memory cells. In this regard, assuming Gaussian distributions and a conventional, general or typical mismatch model whereby the standard deviation affecting a characteristic is proportional to its absolute value, the standard deviation of state "1", reference state, and state "0" may be expressed as:

For state "1", a level of $\xi_1$ affected by a standard deviation $\alpha\xi_1$ For the reference state, a level of $\xi_{Ref}$ affected by a standard deviation $\alpha\xi_{Ref}/\sqrt{N}$ (N pairs of reference placed in parallel)

For state "0", a level of $\xi_0$ affected by a standard deviation $\alpha\xi_0$ With that in mind, where the reference level is placed classically midway between state "1" and state "0" levels (i.e. if $\xi_{Ref}=(\xi_1+\xi_0)/2$), the one sigma difference between state "1" and "reference" distribution levels may be characterized as:

$$\Delta_{1\text{-}Ref}=\xi_1(0.5-\alpha(1+1/\sqrt{N}))-\xi_0(0.5+\alpha/2\sqrt{N})$$

while the one sigma difference between the "reference" and "0" distribution levels may be characterized as:

$$\Delta_{Ref\text{-}0}=\xi_1(0.5-\alpha/2\sqrt{N})-\xi_0(0.5+\alpha(1+1/\sqrt{N}))$$

The particular case where $\alpha=0$ leads to symmetrical one-sigma distribution differences equal to:

$$\Delta_{1\text{-}Ref}=\Delta_{Ref\text{-}0}=0.5*(\xi_1-\xi_0).$$

Figure 5:
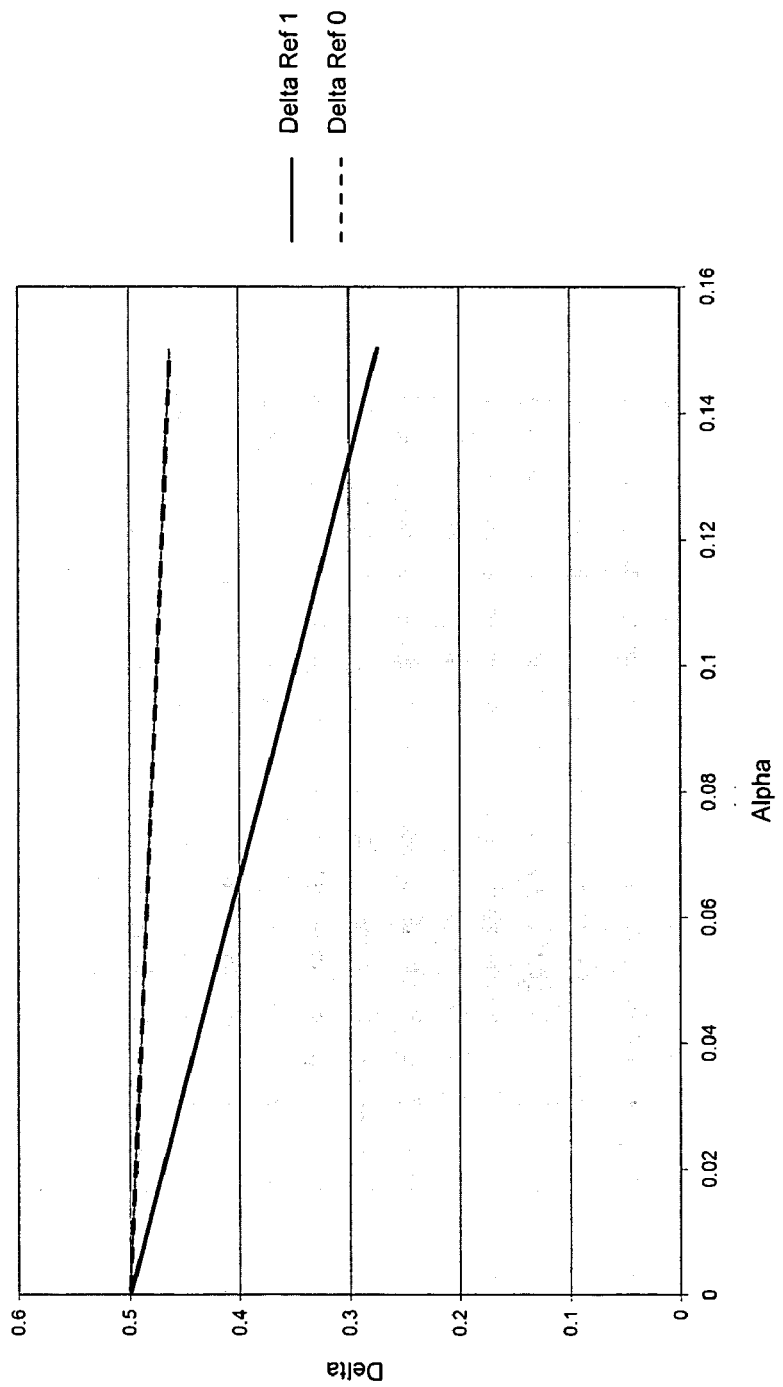
FIG. 5 is a graphical representation of the evolution of one-sigma margins on state "1" and state "0" as a function of the mismatch proportionality coefficient.

Setting $\alpha=0$ may be considered an "ideal" situation, and under this circumstance, the "positioning" the reference level midway between state "1" and state "0" levels is "ideal or "perfect". However, in practice or reality $\alpha\neq 0$, with reference to the relationships set forth above, as well as illustrated in the chart/graph of FIG. 5

$$\Delta_{1\text{-}Ref}<\Delta_{Ref\text{-}0}.$$

As such, more reading failures are typically expected when reading memory cells storing a state "1" than when reading memory cells storing a state "0".

The present inventions control, adjust, determine and/or modify the absolute and/or relative positioning or location (i.e., absolute or relative amount) of reference current which is employed by sensing circuitry to sense the data state of a memory cell during a read operation of one or more memory cells. The control, adjustment, determination and/or modification of the reference current levels may be implemented using many different, distinct and/or diverse techniques and circuitry, including both analog and digital techniques and circuitry. All such implementations and techniques, whether now known or later developed, are intended to fall within the present inventions.

In one embodiment, the reference current level (employed during a read operation) is adjusted, set, determined and/or controlled via transistor "ratioing". Here, the division by 2 employed to obtain the midway reference in a conventional approach is replaced by a division by "k" (k>2) via current source scaling. The determination of "k" may be controlled, set and/or a function of, for example, the characteristic of the design and its technology implementation.

Figure 6:
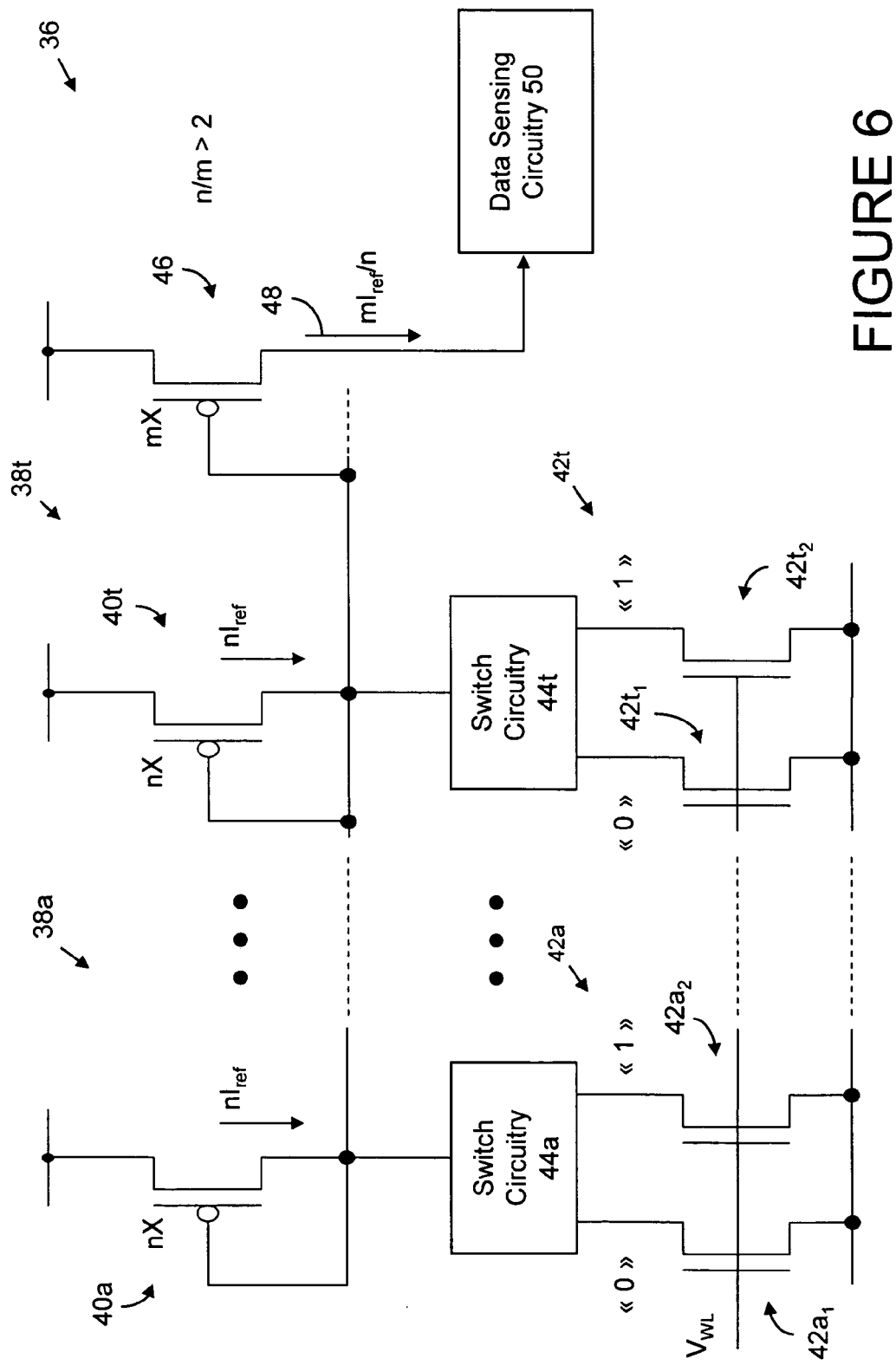
FIG. 6 is a schematic representation of one embodiment of one aspect of the present inventions whereby the reference current level (employed during a read operation) is adjusted, set, determined and/or controlled via transistor "ratioing", according to an exemplary embodiment of an aspect of the present inventions.

For example, with reference to FIG. 6, in one embodiment, reference current generator circuitry 36 includes a plurality of reference networks 38a-38t. In this embodiment, reference networks 38a-38t include current driver 40a-40t, respectively. Each current driver 40a-40t includes a transistor having a geometry multiplier of "n". In this regard, nX makes reference to an "n" times a basic geometry (for example, "n" times a width/length ratio of "X").

In this embodiment, each reference network 38 includes a reference cell circuit 42 having a plurality of reference cells $42x_y$ (for example, reference network 38a includes reference cell circuit 42a having more reference cells $42a_1$, and $42a_2$). Notably, in the illustrative embodiment, each reference cell circuit 42 includes reference cell $42x_1$ (for example, an electrically floating body type transistor) which is programmed to logic "1" and reference cell $42x_2$ (for example, an electrically floating body type transistor) which is programmed to logic "0". The reference cells $42x_1$ and $42x_2$ may be programmed via switch circuitry 44x. In this regard, each reference cell 42x may be accessed individually by controlling switch circuitry 44x to isolate one or the other of reference cells 42x and applying appropriate programming voltages to the gate, drain region and source region of the transistor of reference cell 42.

Notably, as mentioned above, the present inventions may be implemented in conjunction with any memory cell technology, whether now known or later developed. For example, the memory cells may include one or more electrically floating gate transistors, one transistor-one capacitor architecture (1T-1C), JFETS, electrically floating body transistors, or any other memory/transistor technology whether now known or later developed. Typically, reference cells 42 are the same as or representative of the memory cell employed in the integrated circuit device (for example, a logic device, such as, a microcontroller or microprocessor, or a memory device, such as, a discrete memory). Indeed, such reference cells 42 are often disposed in the memory cell array.

The reference current generator circuitry 36 further includes reference current driver 46. The current driver 46 includes a geometry multiplier of "m" and, as such, in this configuration generates reference current 48 which is "$I_{ref}/k$" where k=n/m and k>2. The reference current 48 is provided to data sensing circuitry 50 (for example, a cross-coupled sense amplifier). The data sensing circuitry 50 employs reference current 48 to determine, sense and/or sample the data state of a memory cell 12 having an electrically floating body transistor 14.

In one embodiment, data sensing circuitry 50 includes data sense amplifier circuitry, for example, circuitry including a cross-coupled sense amplifier. Briefly, with reference to FIG. 7, in one embodiment, the data sense amplifier circuitry receives at least one bit line (having a plurality of memory cells 12 coupled thereto) and the reference current generated by reference generator circuitry 36. The data sense amplifier circuitry senses the data state stored in memory cell 12 and/or writes-back data into memory cell 12. In this regard, the data sense amplifier circuitry may compare the current from the selected memory cell to the reference current generated by reference generator circuitry 36. From that comparison, it may be determined whether memory cell 12 contained logic high (relatively more majority carries 34 contained within body region 18) or logic low data state (relatively less majority carries 28 contained within body region 18).

Notably, the present inventions may employ any type or form of data sense amplifier circuitry and/or data sensing circuitry 50, whether now known or later developed, to read the data stored in memory cells 12 and/or write data in memory cells 12. For example, in one embodiment, the data sense amplifier circuitry may be a cross-coupled type sense amplifier as described and illustrated in the Non-Provisional U.S. patent application Ser. No. 11/299,590 (U.S. Patent Application Publication US 2006/0126374), filed by Waller and Carman, on Dec. 12, 2005, and entitled "Sense Amplifier Circuitry and Architecture to Write Data into and/or Read Data from Memory Cells", the application being incorporated herein by reference in its entirety.

It may be advantageous to implement or employ a digital technique to adjust, define, set, determine and/or control the reference voltage or current level used to read the state of the memory cell including adjusting defining, setting, determining and/or controlling the reference voltage or current level applied to the sense amplifier in such a way as to adjust, define, set, determine and/or control the weight on the memory cells storing state "0" relative to the memory cells storing state "1".

Figure 8:
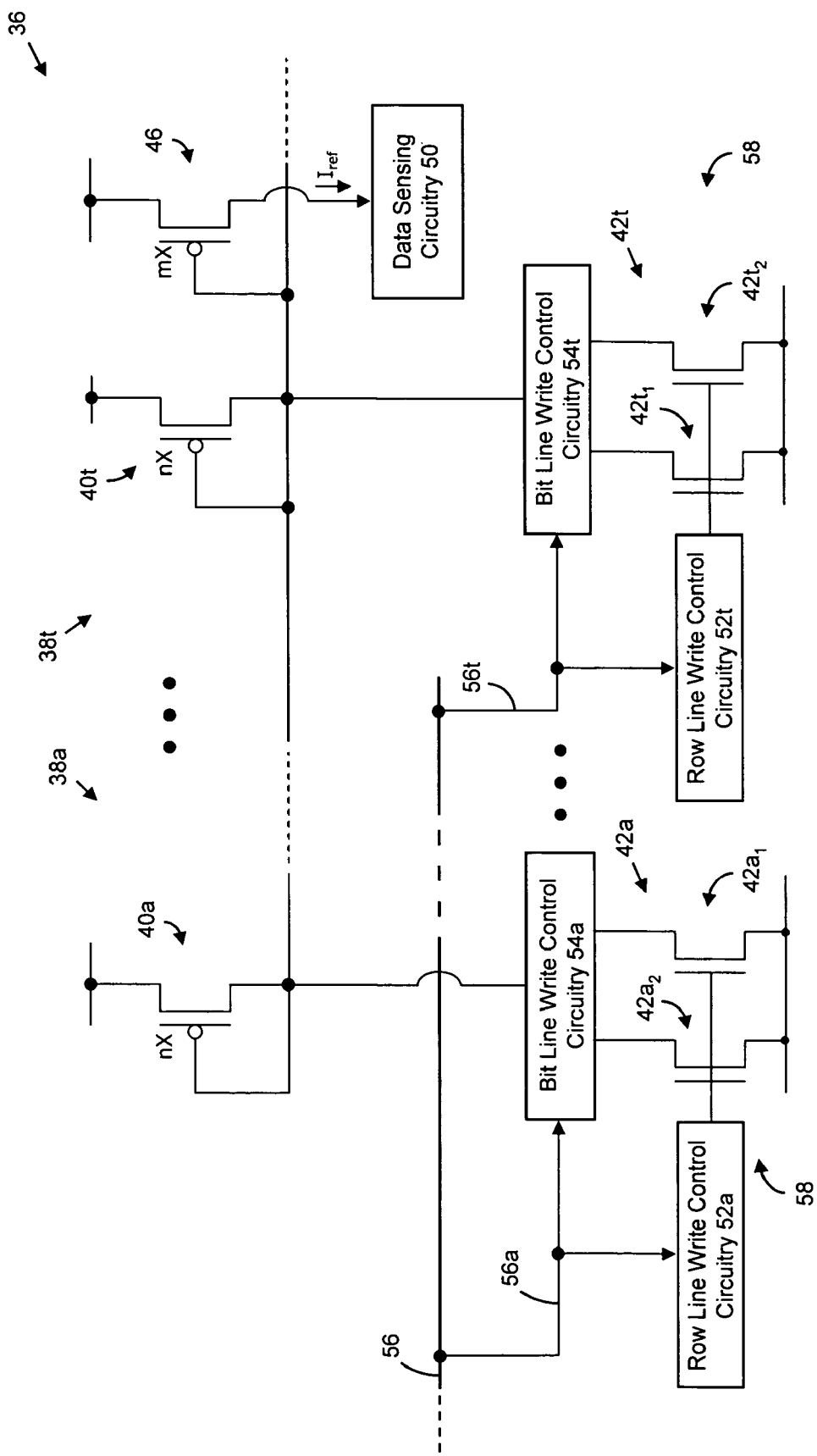
FIG. 8 is a schematic representation of an exemplary embodiment of reference current generation circuitry including a plurality of pairs of reference cells, which are programmed and/or controlled via control data, providing digital control of the reference current level (employed during a read operation) according to an exemplary embodiment of an aspect of the present inventions.

For example, with reference to FIG. 8, reference current generator circuitry 36 includes one or more selectively programmable reference cells (for example, a pair of reference cells) that are programmed, controlled and/or configured using control data (for example, a control bit, bits or word). In one embodiment, reference cells are programmed, controlled and/or configured to opposite data states (for example, where there are two reference cells, one of the reference cells is programmed to logic state "1" and another reference cell is programmed to logic state "0"). In another embodiment, reference cells may be programmed, controlled and/or configured to the same data state (for example, where there are two reference cells, both reference cells are programmed to logic state "1" or logic state "0").

Figure 1A:
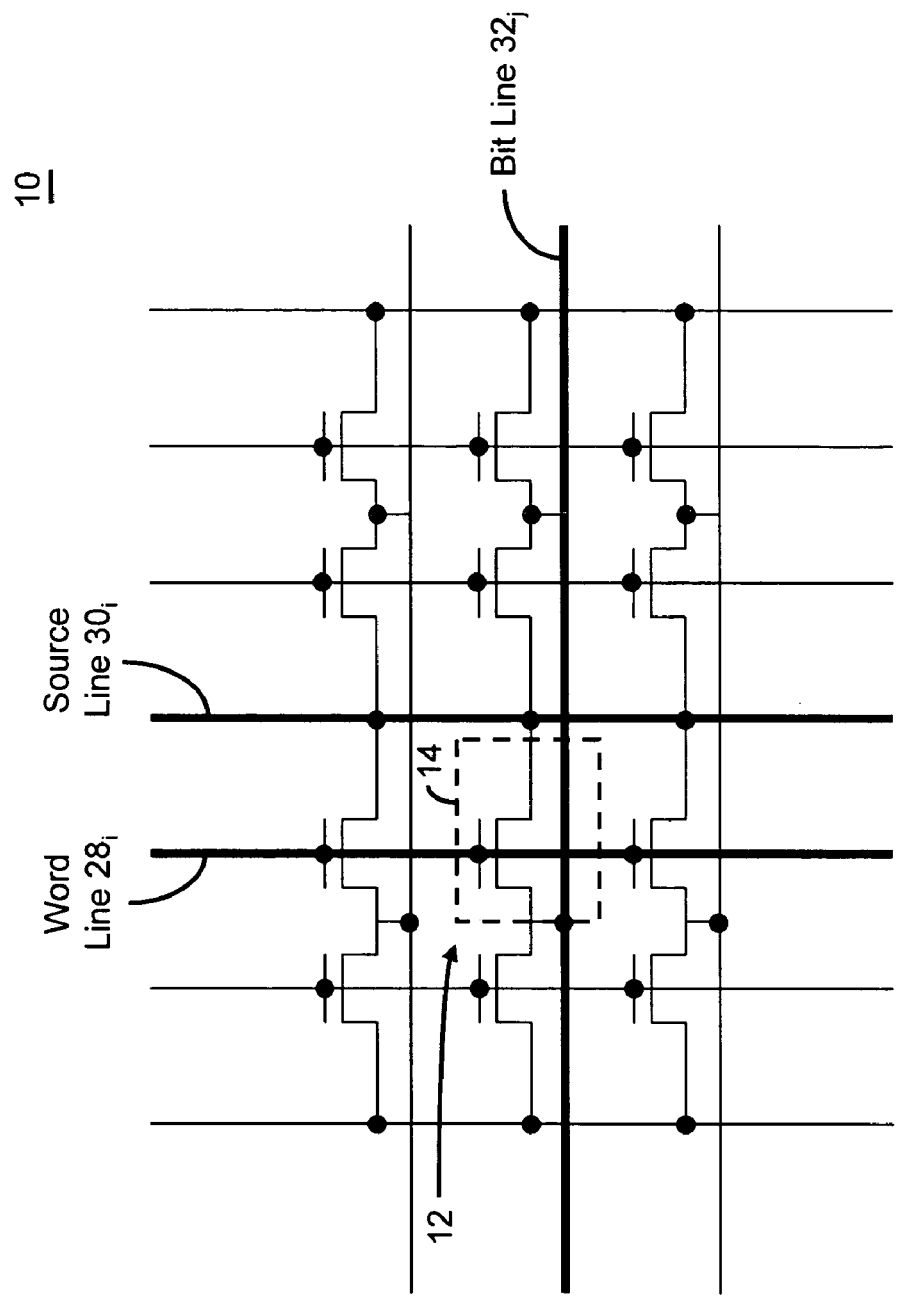
FIG. 1A is a schematic representation of a prior art electrically floating body SOI DRAM array including a plurality of memory cells, each memory cell including an electrically floating body transistor (N-type transistor)
Figure 1B:
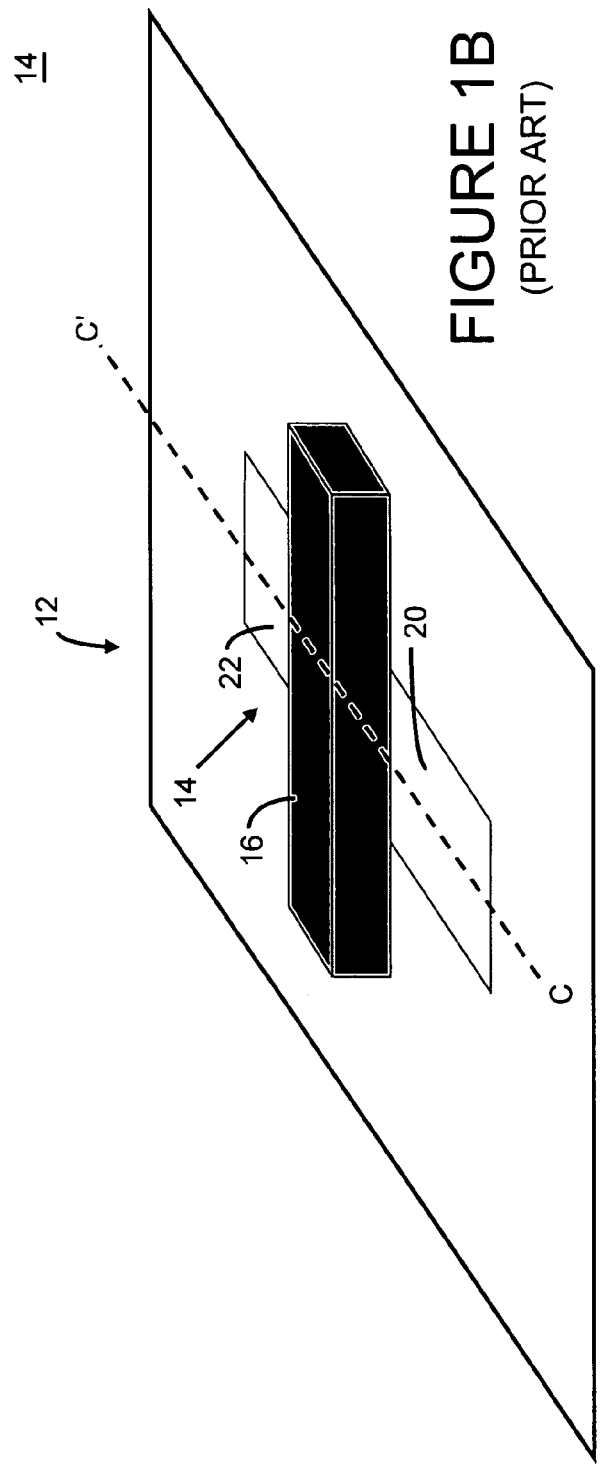
FIG. 1B is a three dimensional view of an exemplary prior art memory cell comprised of one electrically floating body transistor (PD-SOI NMOS)
Figure 1C:
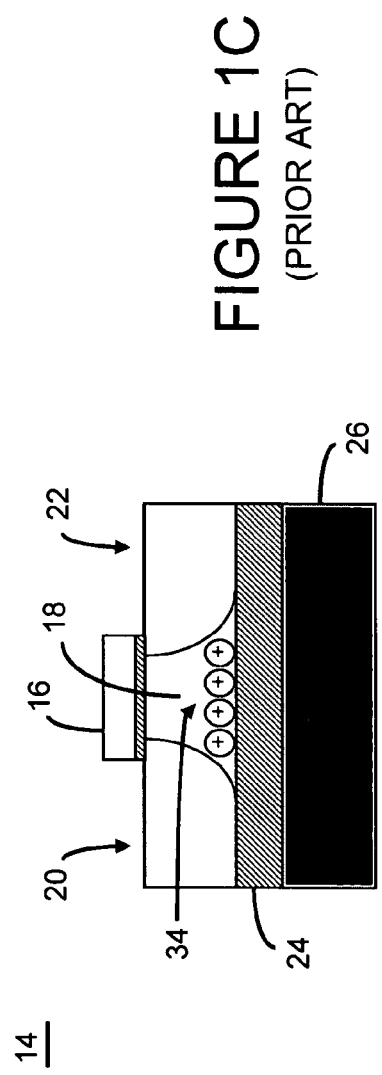
FIG. 1C is a cross-sectional view of the prior art memory cell of FIG. 1B, cross-sectioned along line C-C'.
Figure 2A:
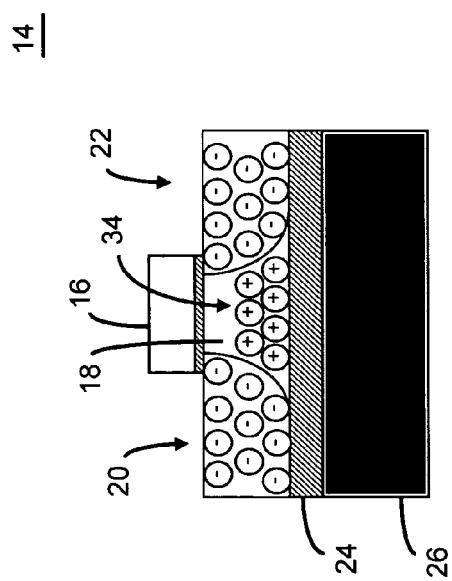
FIGS. 2A and 2B are exemplary schematic illustrations of the charge relationship, for a given data state, of the floating body, source and drain regions of a prior art memory cell having an electrically floating body transistor (N-type transistor)
Figure 2B:
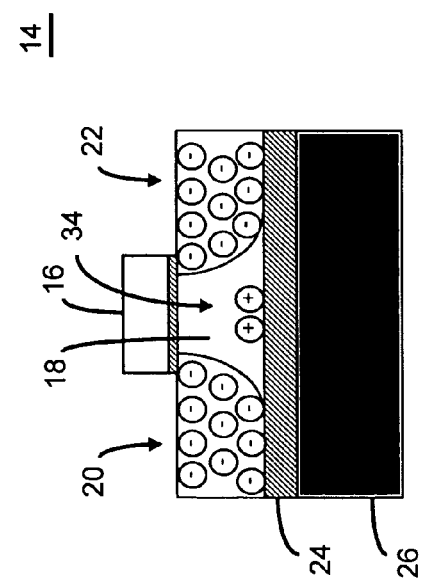
Figure 3:
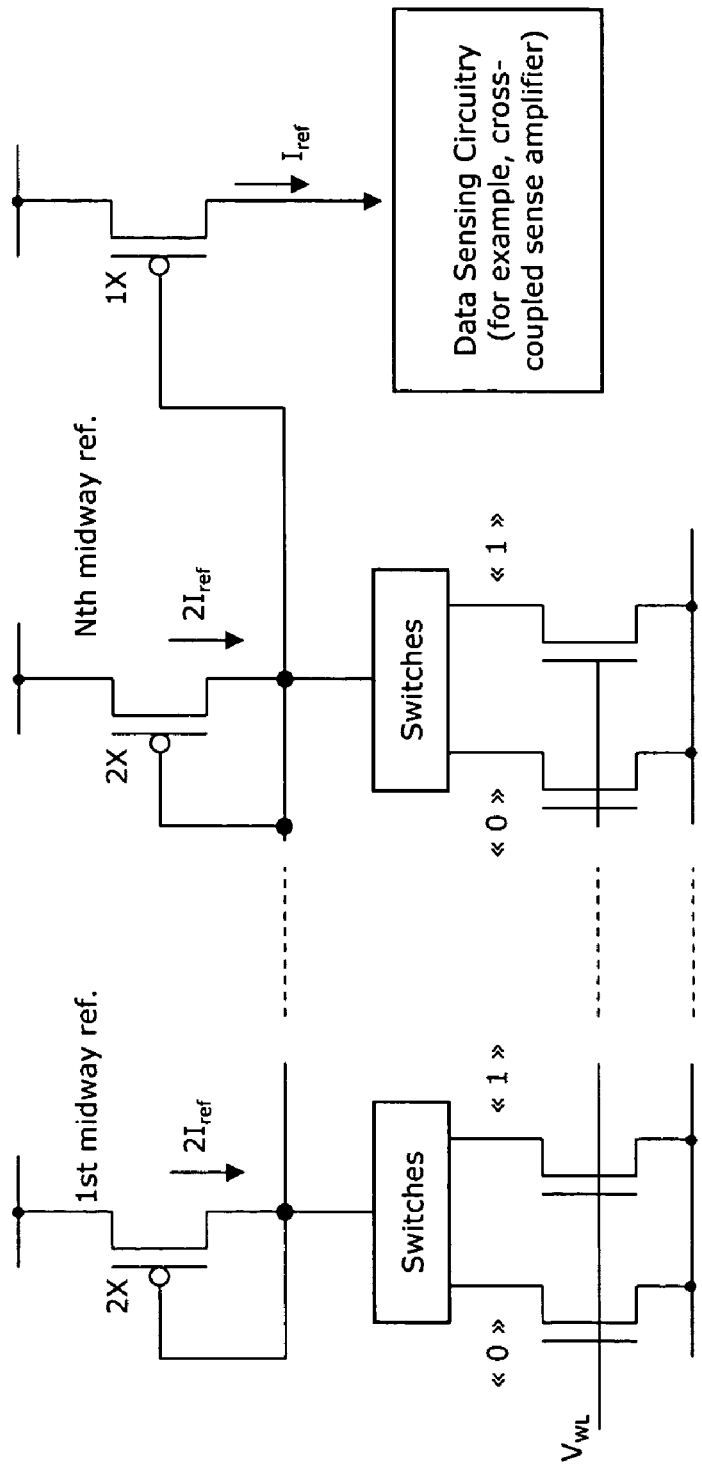
FIG. 3 is a schematic representation of a prior art reference current generator which is combined by connecting a plurality of midpoint current generators in parallel.
Figure 4:
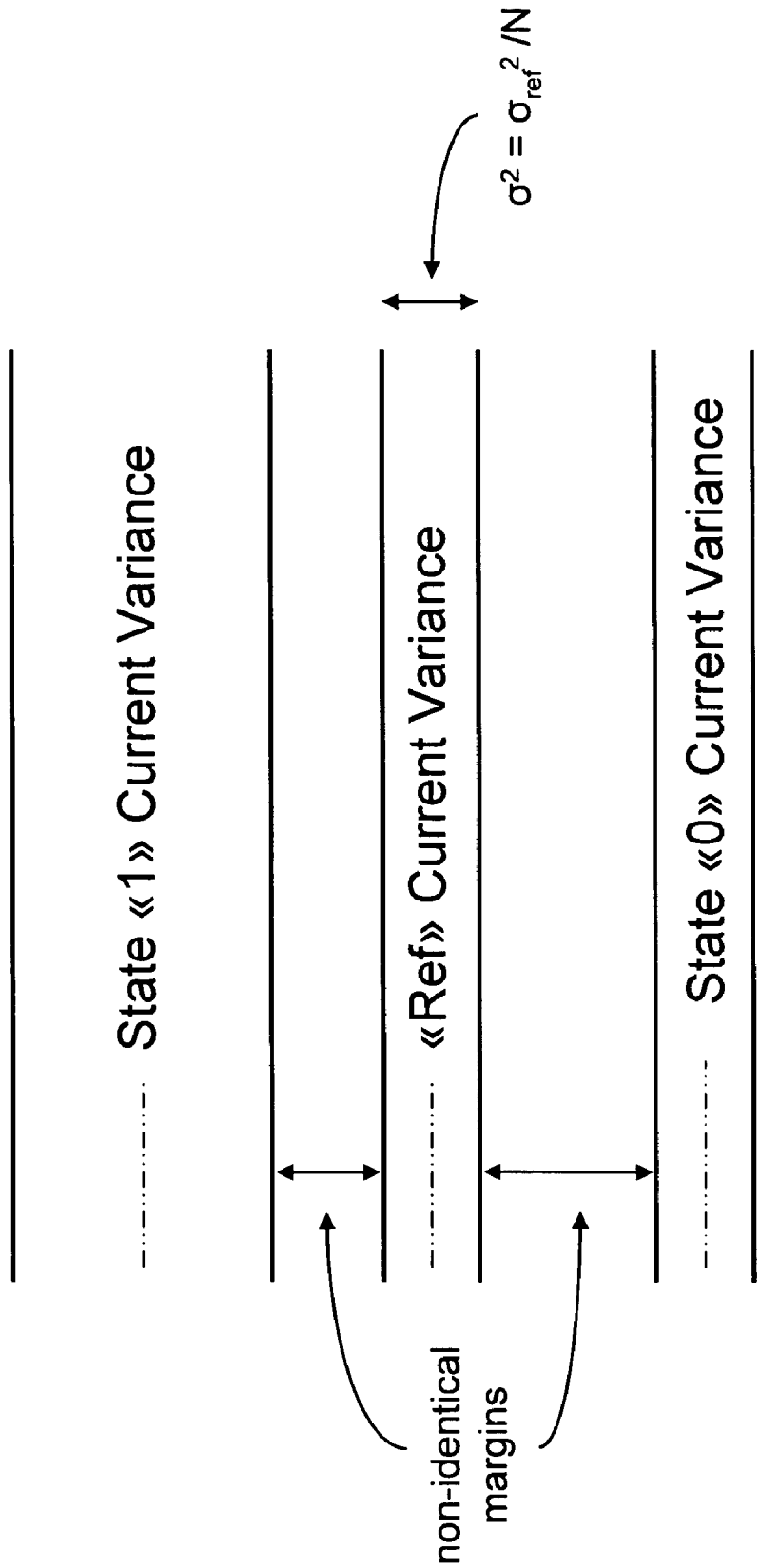
FIG. 4 is an illustration of the current variance pertaining to state "1", reference, and state "0" in an electrically floating body SOI DRAM in conjunction with the impact of, for example, various mismatching and/or manufacturing tolerances of the memory cell, reference current generation, and/or transistors of the sense amplifier.

Notably, in certain embodiments, the current generated by a reference cell programmed to logic state "1" is greater than the current generated by a reference cell programmed to logic state "0". Under these circumstances, it may be advantageous to lower the reference level (shift, adjust, control and/or change the reference level towards the "0" state) to "re-balance", control, adjust or shift the read margins. (See, for example, FIG. 4). As such, in this embodiment, all (or a majority) of the reference cells $42x_x$ (for example, both reference cell $42x_x$ and reference cell $42x_{x+1}$ of reference cell circuit 42x) of one or more of the reference cell circuits 42 are programmed to logic state "0" to adjust, control, shift and/or change the read margins.

In particular, with reference to FIG. 8, in one embodiment, reference current generator circuitry 36 includes a plurality of reference networks 38a-38t. Each reference network 38 includes current driver 40 and reference cell circuit 42 having one or more reference cells $42x_y$ (each reference cell including, for example, an electrically floating body type transistor). In this embodiment, current driver 40 includes a geometry multiplier of "n" (for example, 2x). The reference cells 42 may include one or more reference cells $42x_y$ which are similar to (or the same, substantially the same as, representative or substantially representative of) the memory cells of the memory cell array. In this illustrative embodiment, reference network 38 includes an associated pair of reference cells $42x_1$ and $42x_2$ each including an electrically floating body type transistor.

The reference current generator circuitry 36 further includes row line write control circuitry 52 and bit line write control circuitry 54 (circuitry 52 and 54 may be, for example, controllable or configurable signal generators, switches and/or multiplexers). The row line write control circuitry 52 and bit line write control circuitry 54 facilitate programming, controlling and/or configuring of reference cell circuit 42. In this regard, in response to control data (for example, a control bit, bits or word) applied on control signal lines 56, row line write control circuitry 52 and bit line write control circuitry 54 program, control and/or configure reference cell circuit 42 to a given and/or predetermined state. As noted above, in one embodiment, the reference cells of reference cell circuit 42 are programmed, controlled and/or configured to opposite data states (for example, one of the reference cells is programmed to logic state "1" and another reference cell is programmed to logic state "0"). In another embodiment, reference cells of reference cell circuit 42 are programmed, controlled and/or configured to the same data state (for example, where there are two reference cells, both reference cells are programmed to logic state "1" or logic state "0").

In one embodiment, one or more bits of the control data may be employed to program, control and/or configure the reference cells of reference cell circuit 42. For example, with reference to FIG. 8, in response to the one or more control bits, row line write control circuitry 52 and bit line write control circuitry 54 may program, control and/or configure reference cell $42a_1$ to logic state "1" and reference cell $42a_2$ to logic state "0". Alternatively, such control bits may indicate that reference cell $42a_1$ and reference cell $42a_2$ are programmed to the same logic state (logic state "1" or logic state "0"). In this embodiment, both reference cells reference cell $42a_1$ and reference cell $42a_2$ are written to the same logic state in order to, for example, provide a desired, predetermined and/or suitable weighting such that reference current generator circuitry 36 generates a desired, predetermined and/or suitable reference current 48.

Where the reference cells of reference cell circuit 42 include electrically floating body transistors that store data states in the electrically floating body region of the transistor, selectively writing logic "1" and logic "0" to a particular reference cell may be implemented by controlling the appropriate or associated bit and word lines and applying suitable writing voltages thereon. Indeed, any technique to program the data state of one or more reference cells, whether now known or later developed, is intended to fall within the scope of the present inventions.

In particular, in one embodiment, each reference cell circuit 42 includes electrically floating body transistor $42x_1$ programmed to logic "1" and electrically floating body transistor $42x_2$ programmed to logic "0". The transistors $42x_1$ and $42x_2$ may be programmed via row line write control circuitry 52 and bit line write control circuitry 54. In this regard, each transistor 42x may be individually accessed, via control data, and appropriate programming voltages applied to the gate, drain region and source region of the electrically floating body transistors $42x_1$ and $42x_2$ of reference cell circuit 42.

With continued reference to FIG. 8, reference current generator circuitry 36 further includes reference current driver 46. The reference current driver 46 includes a geometry multiplier of "m" (for example, 1X ). The reference current 48 is provided to data sensing circuitry 50 (for example, a cross-coupled sense amplifier). The data sensing circuitry 50 employs reference current 48 to determine, sense and/or sample the data state of a memory cell 12 having an electrically floating body transistor 14. The data sensing circuitry 50 is discussed in detail herein, for example, above in relation to the exemplary embodiment of FIG. 6.

Thus, where this embodiment is implemented in conjunction with a conventional type data sensing circuitry 50 (which employs a conventional sensing scheme), when connecting N pairs of reference cells 42x to provide reference current 48, the reference current is proportional to the relationship of the device geometry (for example, gate width and/or gate length) of current driver 40 (for example, 2x) and the device geometry (for example, gate width and/or gate length) of reference current driver 46 (for example, 1x). As such, when "r" number of reference cells 42 are set to a first state (for example, logic state "1") via, for example, "r" control bits which are set to a first state and "k" number of reference cells 42 are set to a second state (for example, logic state "0") via "k" control bits which are set to a second state, reference current 48, as measured at the sense-amplifier level, may be characterized as:

$$\xi_{Ref} = \frac{\xi_1(r/2) + (k + r/2)\xi_0}{(r+k)}$$

Notably, in one embodiment, the r+k control bits of the control data may be implemented as a thermometric code. In this embodiment, an important parameter may be the number of bits corresponding to a given or each data state.

In one embodiment, the programmed states of reference cells $42x_y$ may be altered so that a given reference cell $42x_y$ and/or given reference cell circuit 42 (for example, an associated pair of reference cells $42x_y$ and $42x_{y+1}$) are always written to a particular logic state (for example, a pair of reference cells are always or only written to logic state "0"). In this embodiment, the control data may include one or more additional bits which instruct row line write control circuitry 52 and bit line write control circuitry 54 to change and/or swap the data states of the reference cells of a reference cell circuit 42 (for example, swap the data state of a pair of reference cells). In this way, the logic state stored in one or more reference cells 42 may be changed (for example, periodically or intermittently) to enhance the long term stability and "placement" (relative or absolute) of reference current 48.

With continued reference to FIG. 8, the control data for controlling and/or configuring reference cell circuits 42 may be fixed and/or predetermined. In one embodiment, the control data may be provided to reference cell bank 58 at start-up/power-up and/or during an initialization sequence. For example, the control data may be determined via a particular configuration of the state of a certain pin or pins on the package of the device (for example, stand-alone memory device or logic device) and/or provided by external circuitry.

Figure 9A:
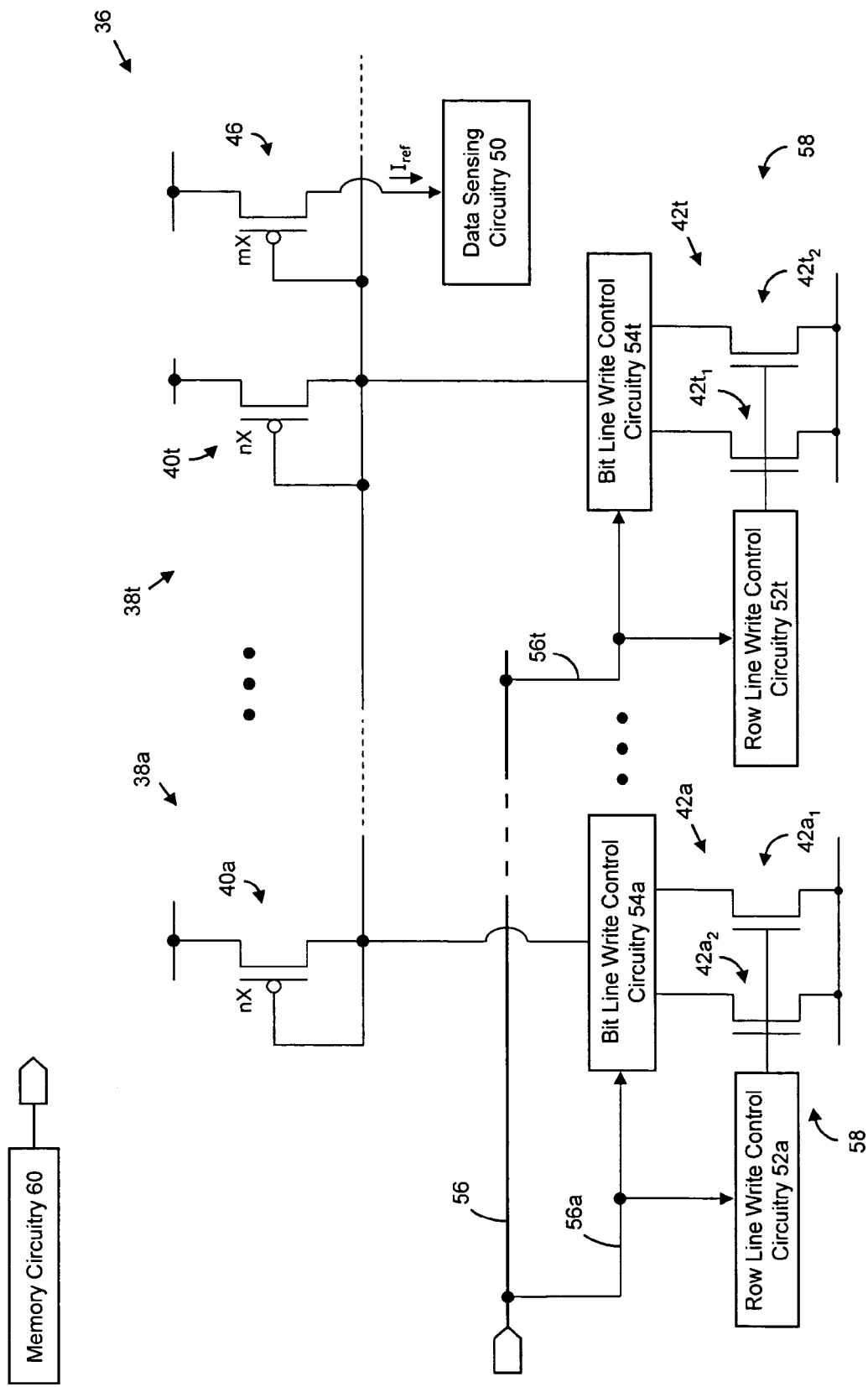
FIGS. 9A-9D are schematic representations of other exemplary embodiments of reference current generation circuitry (including a plurality of pairs of reference cells, which are programmed and/or controlled via control data) in conjunction with a control circuitry and/or memory circuitry, according to an exemplary embodiment of an aspect of the present inventions.

With reference to FIG. 9A, the fixed or predetermined, preset or pre-programmed reference current control word may be permanently, semi-permanently or temporarily (i.e., until re-programmed) by way of memory circuitry 60 (for example, a register, plurality of DRAM, SRAM, ROM, PROM, EPROM, EEPROM cells that are resident on (i.e., integrated in) the device or off-chip (for example, disposed on a memory card on which the device resides). Moreover, memory circuitry 60 may be fuses or anti-fuses which are integrated in the device or off-chip to store the control data.

Figure 9B:
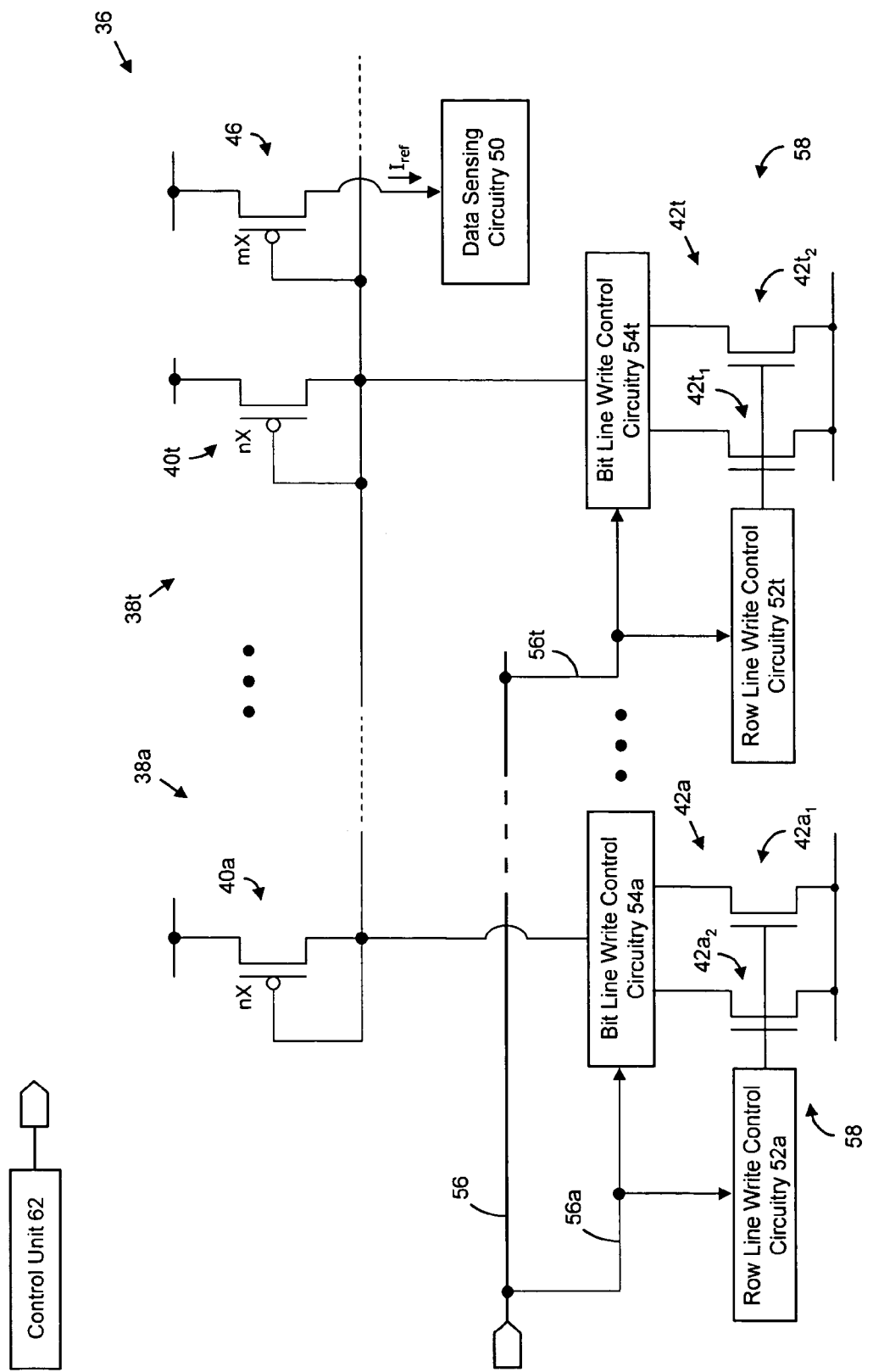

With reference to FIG. 9B, in another embodiment, control circuitry 62 may be employed to implement the setting, calibration and/or tuning techniques for one, some or all of the reference cell banks 58 within the device. In this regard, the control data provided to reference cell bank 58 may be determined for one, some or all reference cells $42x_y$ of reference cell circuits 42 of reference cell bank 58. As such, control circuitry 62 may program or re-program one, some or all reference cells $42x_y$ of reference cell circuits 42. The control circuitry 62 may set, calibrate and/or tune one, some or all of reference cells $42x_y$ and/or reference cell circuits 42 of reference cell bank 58 as described immediately above.

The control circuitry 62 may be, for example, a microprocessor, microcontroller, state machine, discrete logic (for example, CMOS logic), and/or programmable gate array (PGA). The control circuitry 62 may be integrated on the same substrate in which the memory cell and/or memory cell array resides (or is fabricated in). In addition, or in lieu thereof, control circuitry 62 may be integrated on a substrate that is physically separate from (and electrically coupled to or connected with) the substrate in which the associated memory cell and/or memory cell array resides.

Figure 10:
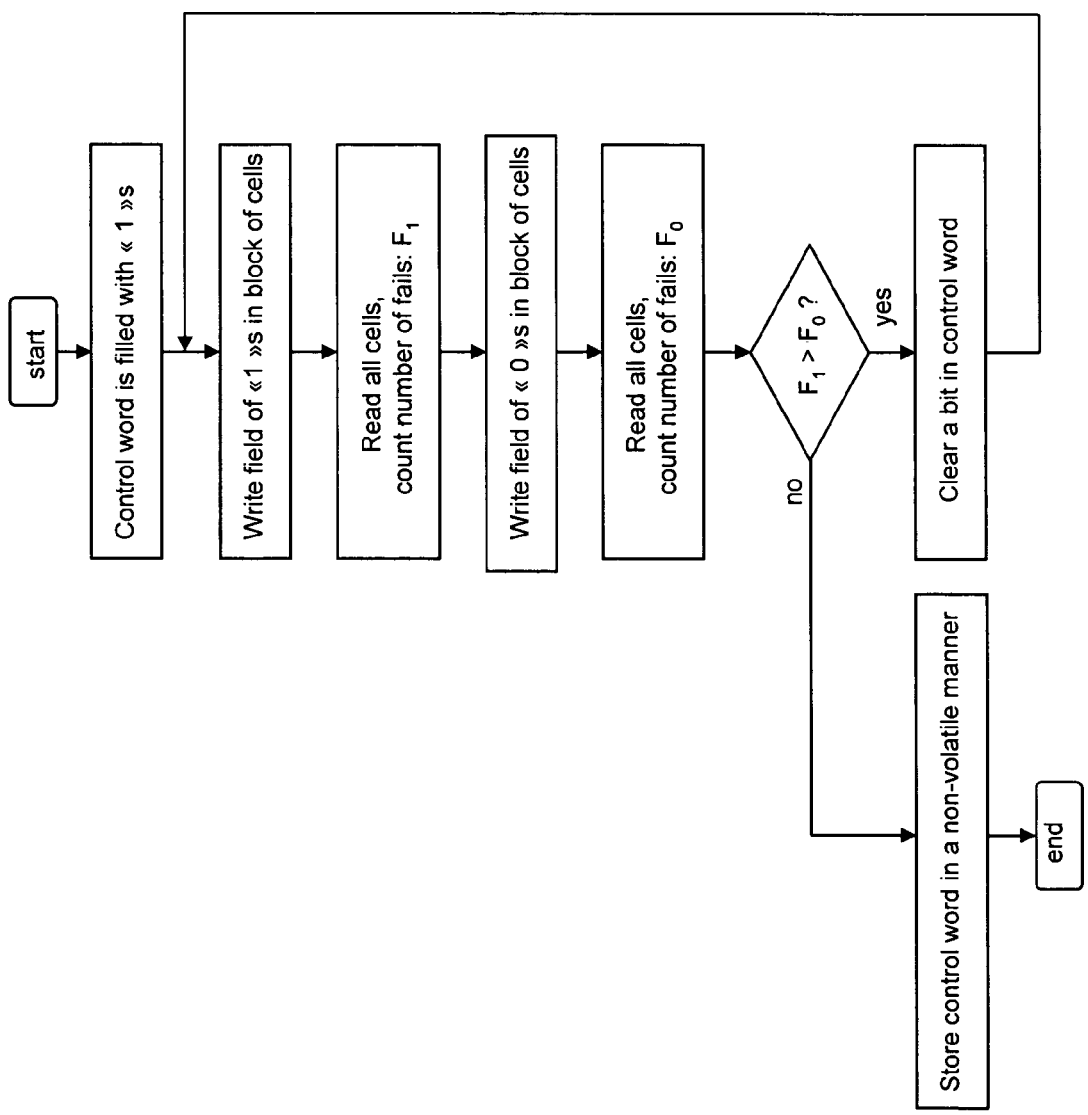
FIG. 10 is an exemplary algorithm that may be employed to determine a value of the digital control word which controls, impacts and/or determines the level of the reference current employed during a read operation.

The control circuitry 62 may employ any programming algorithm whether now known or later developed. For example, control circuitry 62 may implement the exemplary control word programming algorithm of FIG. 10. Notably, in one embodiment, an exemplary algorithm of FIG. 10 may be implemented and/or executed at power up (i.e., before using the memory device), and/or intermittently or periodically during normal operation to compensate for, for example, drift due to temperature variations and/or aging.

Figure 9C:
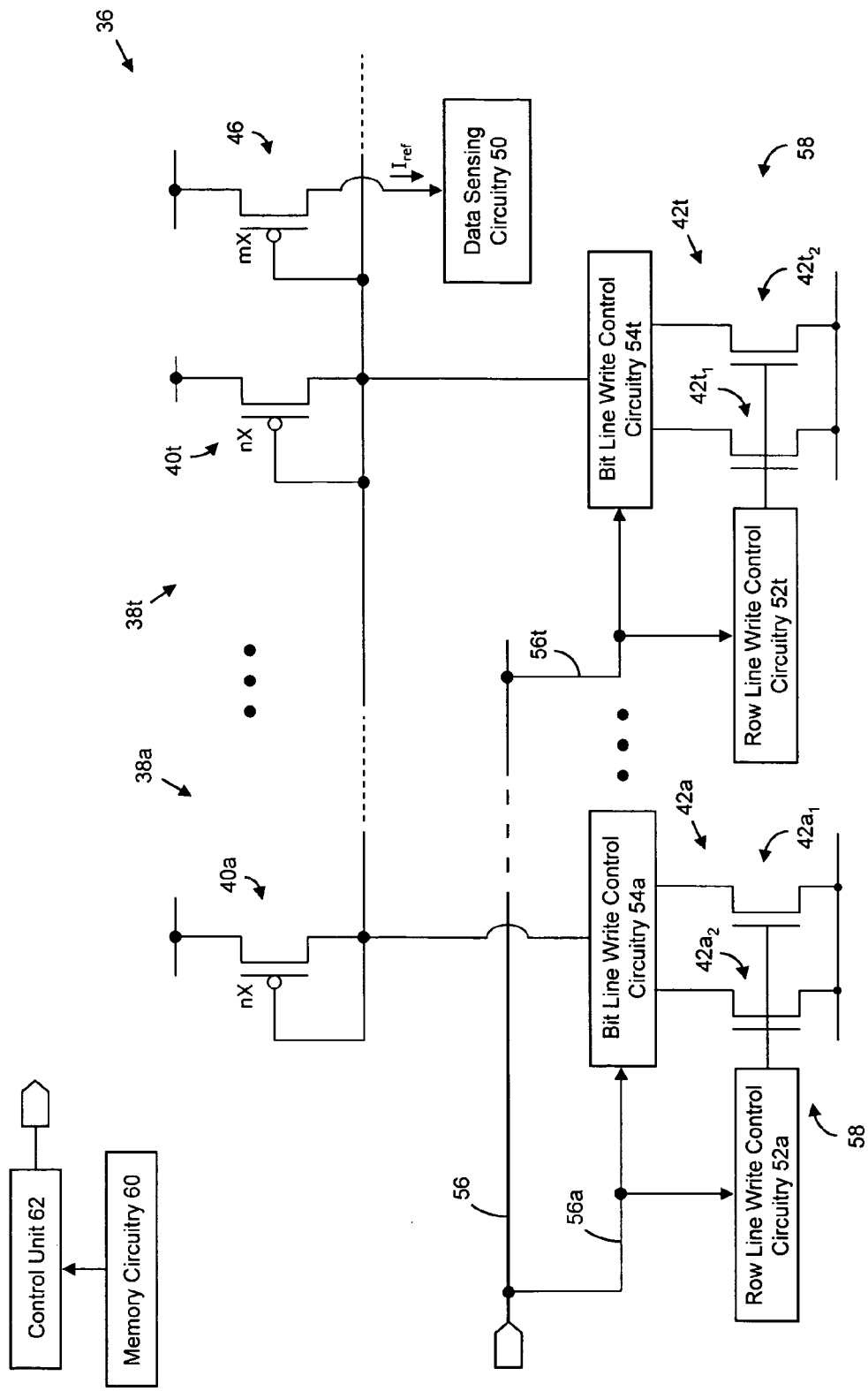
Figure 9D:
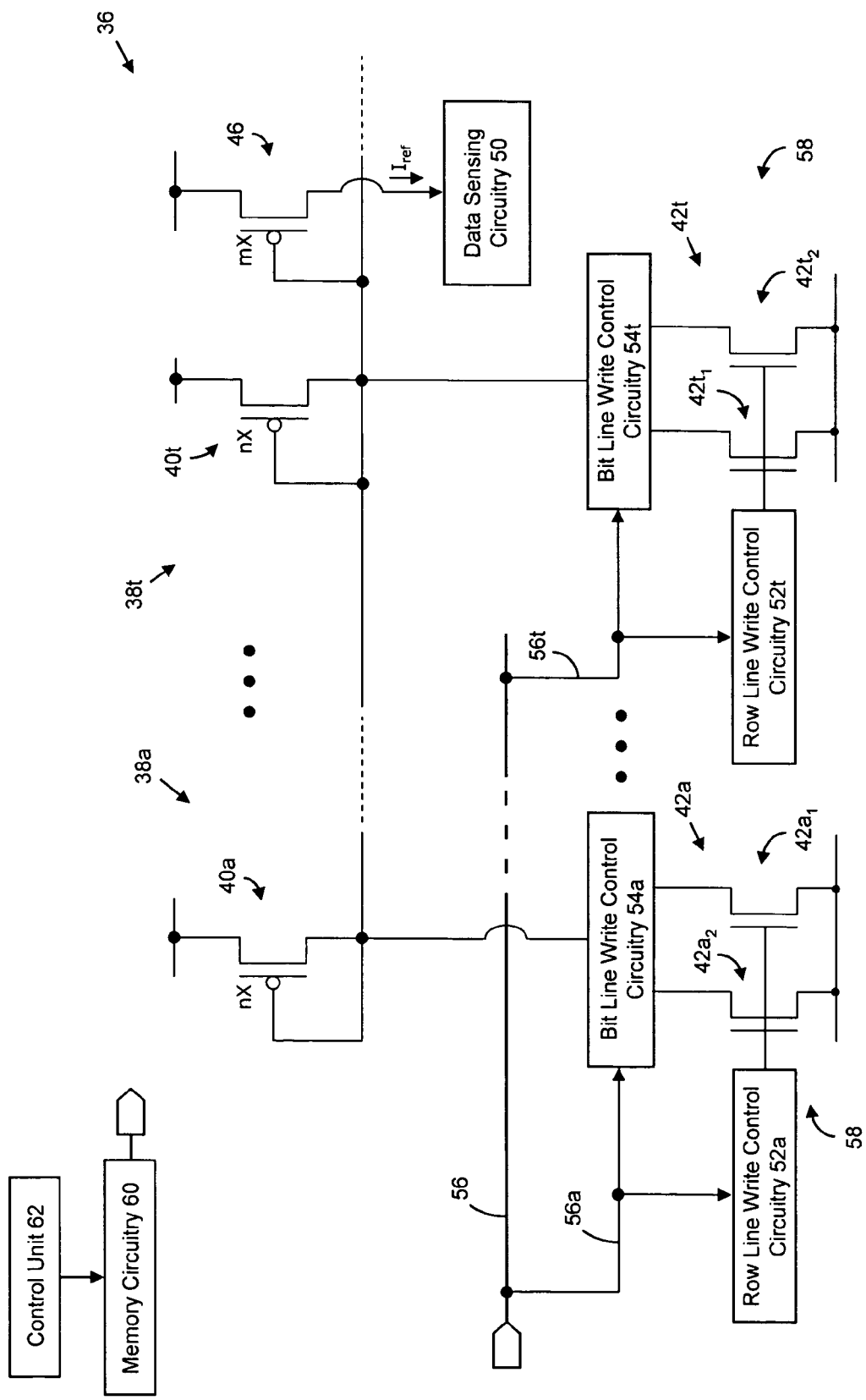

In one embodiment, control circuitry 62 determines and/or calculates the control data. In this embodiment, "initial" control data may be provided at start-up/power-up and/or during an initialization sequence (internally via, for example, memory circuitry 60 (see, for example, FIG. 9C), and/or externally via, for example, control circuitry 62 which may be stored in memory circuitry 60 (see, for example, FIG. 9D)). Thereafter, control circuitry 62 may determine and/or calculate the control data (and one, some or all of one, some or all of reference cells $42x_y$ and/or reference cell circuits 42 and/or reference cell bank 58 re-programmed) during operation to optimize, enhance, compensate and/or adjust reference current 48. For example, reference current 48 may be adjusted during operation to address and/or compensate for variations in operating conditions (for example, to compensate for aging, changes in temperature, and/or response time parameters or characteristics).

Further, in yet another embodiment, the control data may be fine-tuned to enhance the performance of the reference current generator circuitry 36. In this regard, after (or during) the performance of an initialization or re-initialization process, the system (via, for example, control circuitry 62) may implement fine adjustments to the predetermined, preset or pre-programmed control data (which is stored in, for example, memory circuitry 60 and/or provided externally). The adjustments to the control data may be accomplished using any techniques. Notably, all techniques for determining, modifying, changing and/or adjusting the control data, whether now known or later developed, are intended to be within the scope of the present inventions.

For example, in those embodiments where control circuitry 62 programs and/or re-programs one, some or all of reference cells $42x_y$ and/or reference cell circuits 42 of reference cell bank 58, control circuitry 62 may implement a successive approximation approach to determine control data that, in conjunction with reference current generator circuitry 36, provides an optimized, enhanced, compensated and/or adjusted reference current 48. In this embodiment, control circuitry 62 may store the control data in successive approximation registers.

Notably, in one aspect of the inventions, reference current generator circuitry 36 provides an improved reference current positioning by taking into consideration the sub-micron matching characteristics by, for example, shifting the reference level of electrical characteristic toward the lower magnitude level to provide $\Delta 1$-Ref=$\Delta$Ref-0 notwithstanding $\alpha \neq 0$.

Figure 7:
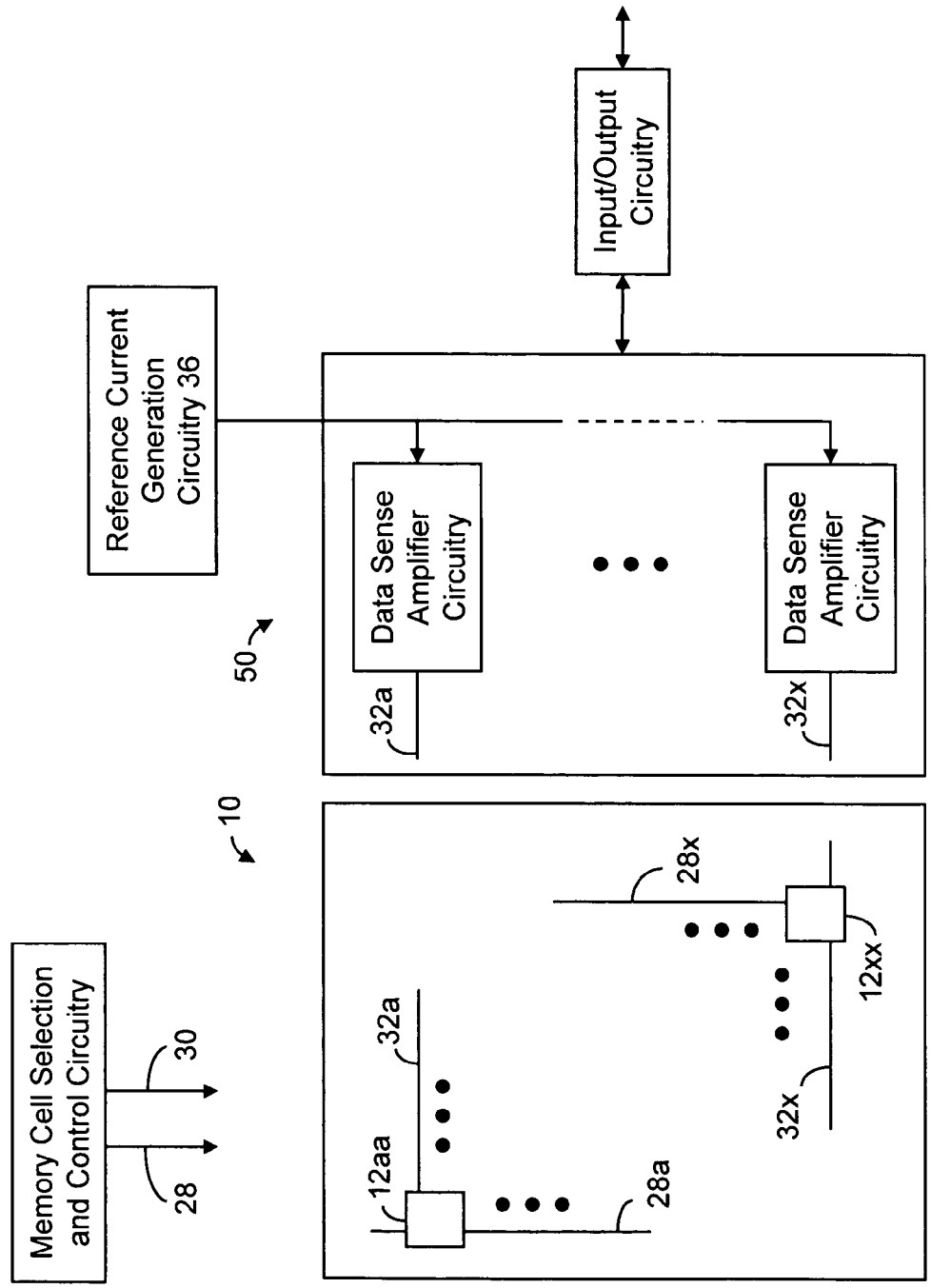
FIG. 7 is a schematic block diagram of an exemplary embodiment of an integrated circuit device including, among other things, a memory cell array, data sensing circuitry, reference current generation circuitry, and memory cell selection and control circuitry, according certain aspects of the present inventions.
Figure 11A:
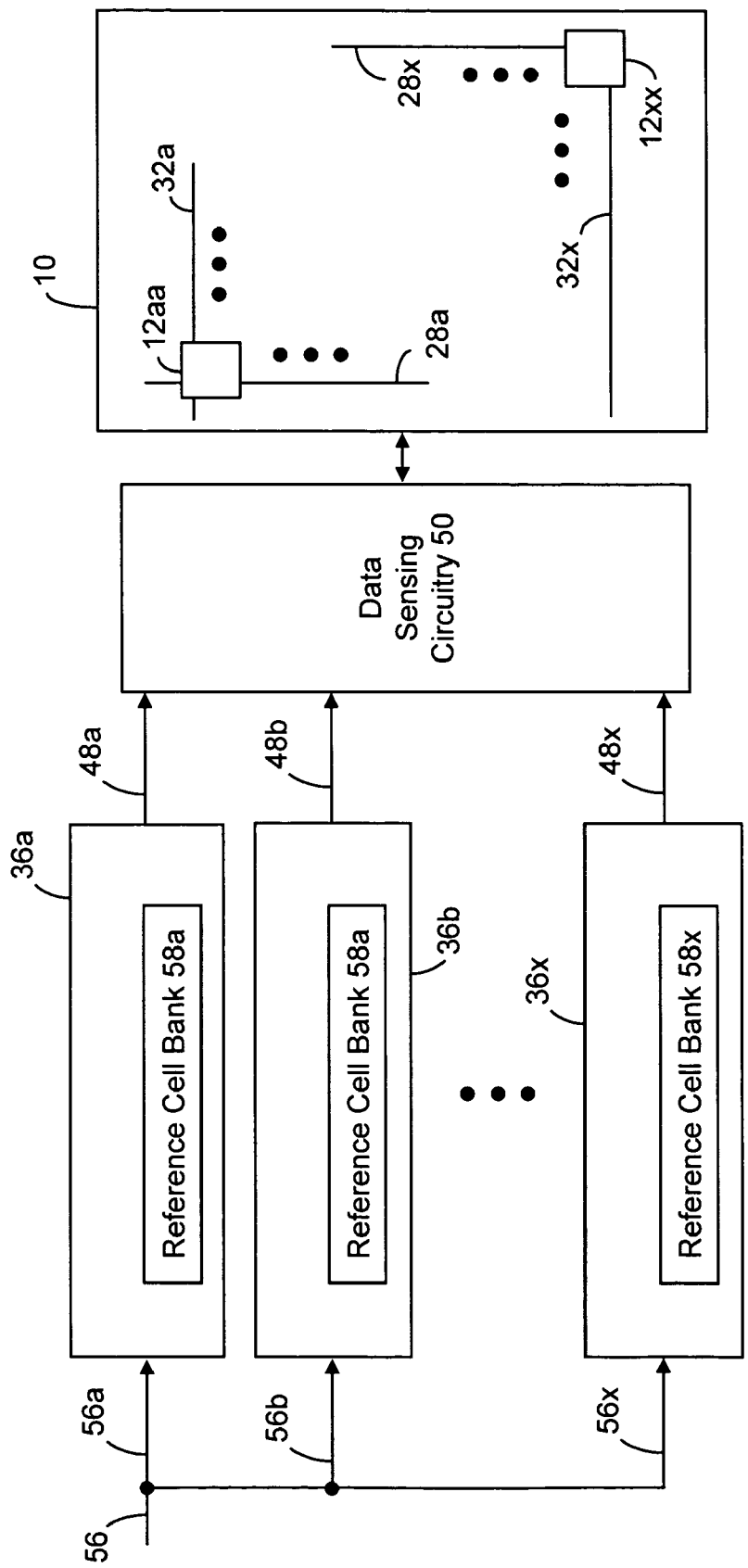
FIGS. 11A-11E are schematic representations of certain embodiments of reference current generation circuitry (including a plurality of reference current generation circuits) in conjunction with, for example, data sensing circuitry, memory cell array, a control circuitry and/or memory circuitry, according to an exemplary embodiment of an aspect of the present inventions.

With reference to FIGS. 7 and 11A, in one embodiment, the integrated circuit device may include reference current generation circuitry 36 which includes a plurality of reference current generation circuits 36a-36x. The reference current generation circuits 36a-36x generate one or more reference currents which are employed by data sense amplifier circuitry of data sensing circuitry 50 to determine the data states of one or more memory cells 12 of a memory cell array 10. In this embodiment, reference current generation circuits 36a-36x may include any of the embodiments of reference current generation circuitry described herein (for example, the exemplary embodiments illustrated in FIGS. 6, 8 and 9A-9D).

In one embodiment, the control data employed by reference current generator circuits 36a-x to generate reference currents 48a-x, respectively (via, among other things, reference cell banks 58a-58x, respectively), may be fixed and/or predetermined for one, some or all reference current generator circuits 36a-x. The control data provided to a given bank 58 may be the same or different for other banks 58. In one embodiment, control data may be provided to reference current generator circuits 36a-x at start-up/power-up and/or during an initialization sequence. In this embodiment, control data may be determined via a particular configuration of the state of a certain pin or pins on the package of the device and/or provided by external circuitry.

Figure 11B:
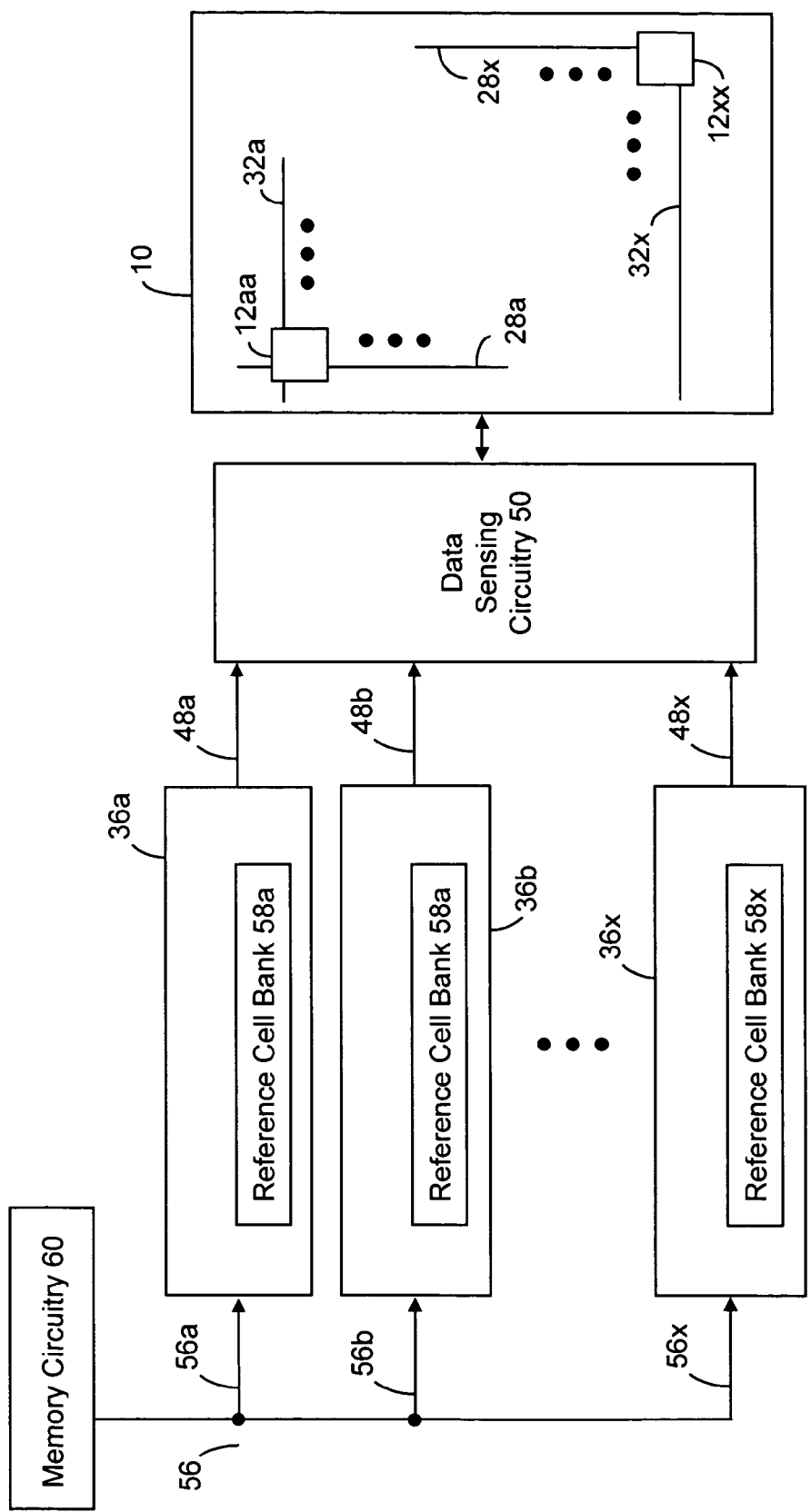

Further, with reference to FIG. 11B, the fixed or predetermined, preset or pre-programmed reference current control word may be permanent, semi-permanent or temporary (i.e., until re-programmed) by way of memory circuitry 60. The memory circuitry 60 may be, for example, a register, plurality of DRAM, SRAM, ROM, PROM, EPROM, EEPROM cells that are resident on (i.e., integrated in) the device or off-chip (for example, disposed on a memory card on which the device resides). Moreover, memory circuitry 60 may be fuses or anti-fuses which are integrated in the device or off-chip to store the control data.

Figure 11C:
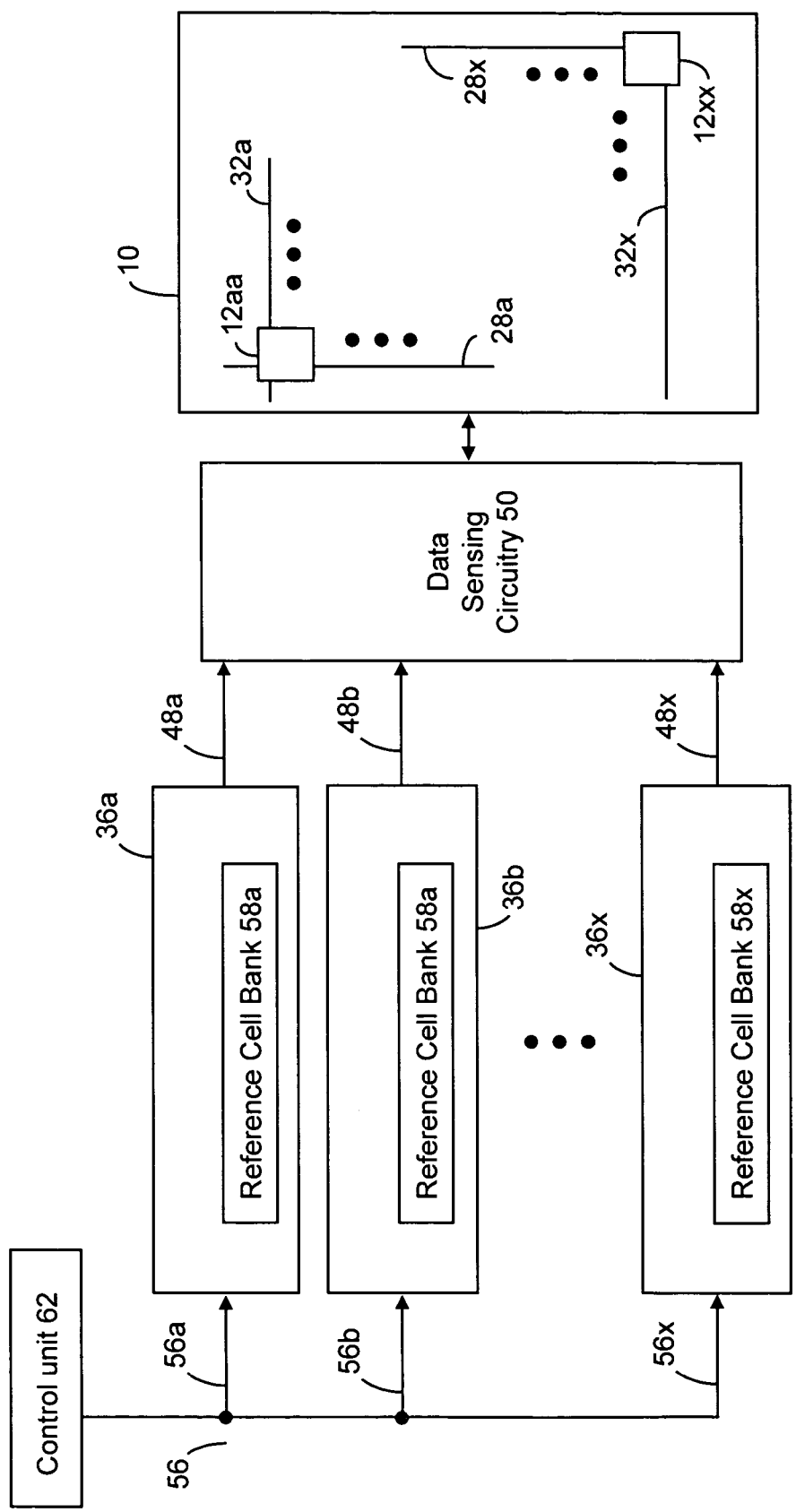

With reference to FIG. 11C, in another embodiment, control circuitry 62 may be employed to implement the setting, calibration and/or tuning techniques for one, some or all of reference cell banks 58a-58x in reference current generation circuits 36a-36x, respectively. In this regard, the control data provided to a given reference cell bank 58 may be determined for one, some or all reference cells of the reference cell circuits of that reference cell bank 58. As such, control circuitry 62 may program or re-program one, some or all reference cells. The control circuitry 62 may set, calibrate and/or tune one, some or all of reference cells and/or reference cell circuits of one, some or all reference cell banks 58a-58x, as described immediately above.

Figure 11D:
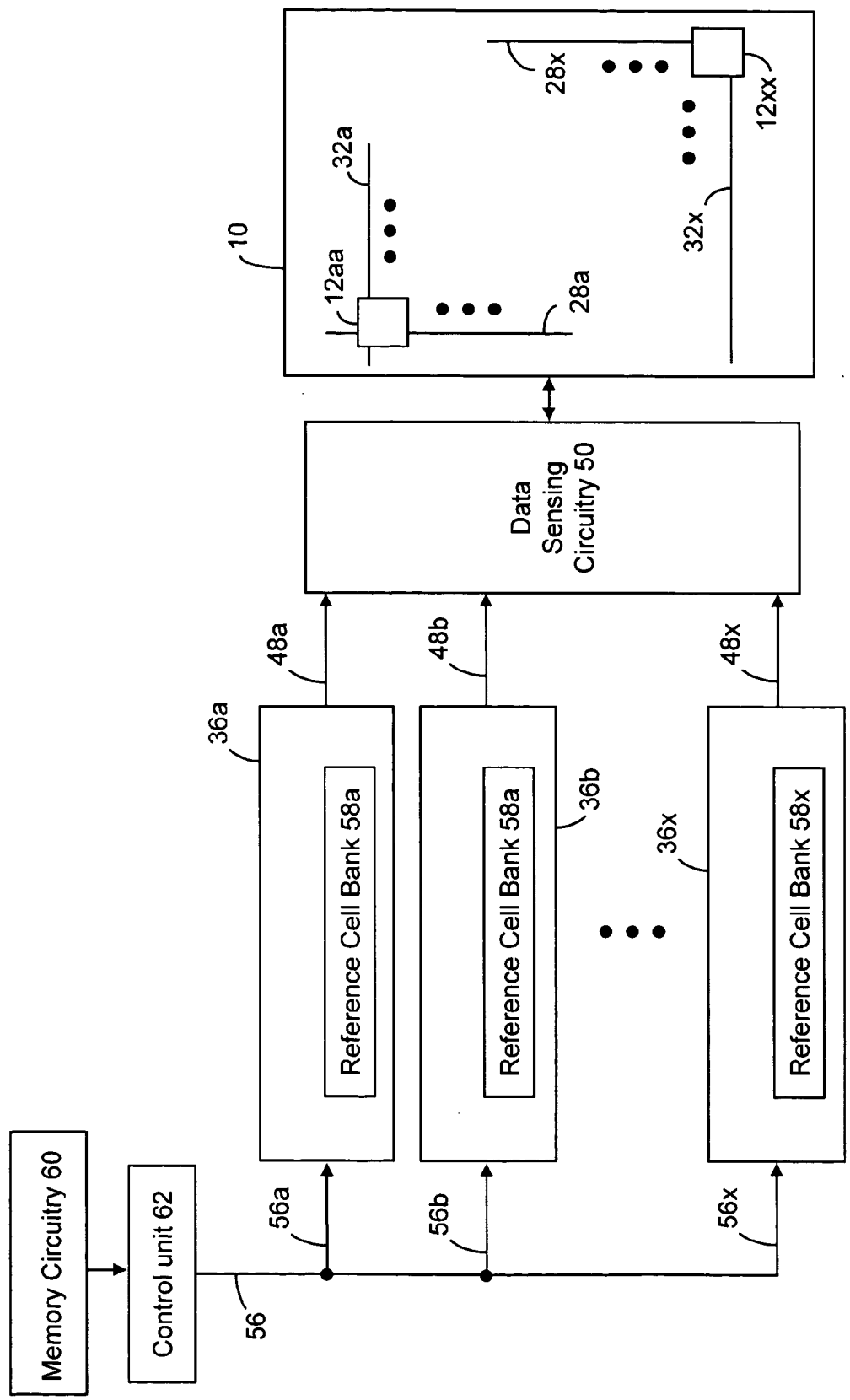
Figure 11E:
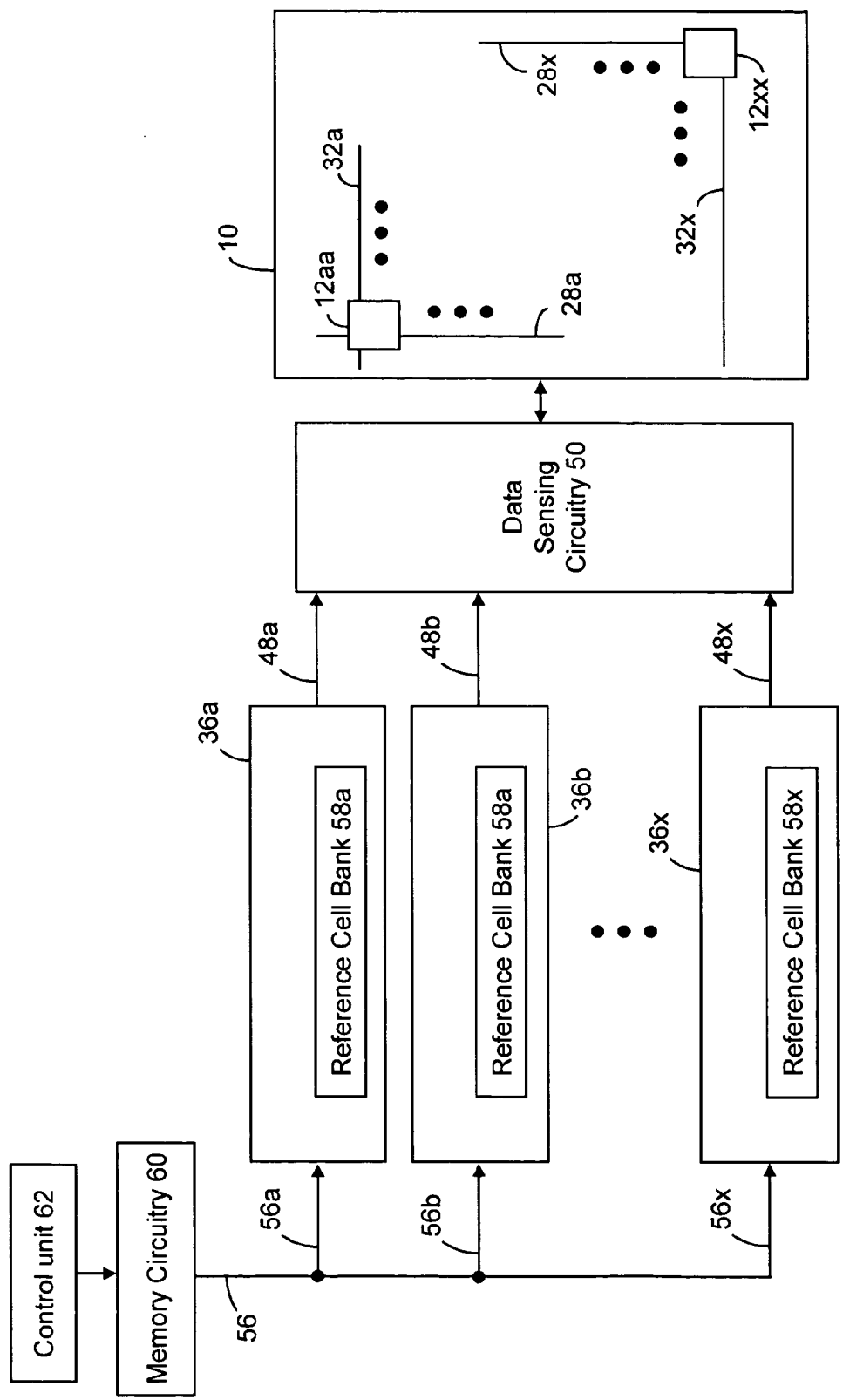

As noted above, in one embodiment, control circuitry 62 determines and/or calculates the control data. In this embodiment, an "initial" reference current control word may be provided at start-up/power-up and/or during an initialization sequence (internally via, for example, memory circuitry 60 (see, for example, FIG. 11D), and/or externally via, for example, control circuitry 62 which may be stored in memory circuitry 60 (see, for example, FIG. 11E)). Thereafter, control circuitry 62 may determine and/or calculate the control data (and one, some or all of reference cells and/or reference cell circuits and/or reference cell banks 58a-x re-programmed) during operation to optimize, enhance, compensate and/or adjust reference currents 48a-x. For example, the reference current may be adjusted during operation to address and/or compensate for variations in operating conditions (for example, to compensate for aging, changes in temperature, and/or response time parameters or characteristics).

Further, in yet another embodiment, control circuitry 62 may fine-tune the control data to enhance the performance of one or more of reference current generator circuits 36a-x of reference current generator circuitry 36. In this regard, after (or during) the performance of an initialization or re-initialization process, control circuitry 62 may implement fine adjustments to the predetermined, preset or pre-programmed control data (which is stored in, for example, memory circuitry 60 and/or provided externally). The adjustments to the control data may be accomplished using any technique. Notably, all techniques for determining, modifying, changing and/or adjusting the control data, whether now known or later developed, are intended to be within the scope of the present inventions.

For example, in those embodiments where control circuitry 62 programs and/or re-programs one, some or all of reference cells and/or reference cell circuits of reference cell banks 58a-x, control circuitry 62 may implement a successive approximation approach to determine control data that, in conjunction with reference current generator circuitry 36, provides an optimized, enhanced, compensated and/or adjusted reference current 48. In this embodiment, control circuitry 62 may store the control data in successive approximation registers.

In addition, the reference current provided by one or more of reference current generator circuit 36a-x may be periodically and/or intermittently "refreshed" in order to provide an enhanced, optimum, desired, predetermined and/or "minimum" reference current. In this regard, in one embodiment, control circuitry 62 may periodically and/or intermittently connect one or more (or all of pairs of reference cells of a given reference cell bank 58, via a switch (or a multiplexer), to one or more banks of the reference cells. In this way, in the event that the reference current provided by one or more banks of reference cells may not be (currently or impending) providing an enhanced, optimum, desired, predetermined and/or "minimum" reference current, for example, after a predetermined or given period of time (during operation or after setting, calibration and/or tuning), the control circuitry may "refresh" those or selected reference cell bank(s) 58.

Moreover, it may be advantageous to alternate the programming of associated reference cells 42 to reduce and/or minimize any memory effect that may result from continuously programming certain reference cells 42 to the same state. As such, in this embodiment, the logic state stored in one or more reference cells 42 may be changed to enhance the long term stability of reference current 48.

As noted above, control circuitry 62 may employ any programming algorithm whether now known or later developed. For example, control circuitry 62 may implement the exemplary control data algorithm of FIG. 10. Notably, in one embodiment, an exemplary algorithm of FIG. 10 may be implemented and/or executed at power up (i.e., before using the memory device), and/or intermittently or periodically during normal operation to compensate for, for example, drift due to temperature variations.

The control circuitry 62, as mentioned above, may program one or more of the reference cell banks 58 of reference current generator circuits 36a-x. In this embodiment, "initial" control data may be provided at start-up/power-up and/or during an initialization sequence. Thereafter, control circuitry 62 may re-program one or more reference current generator circuits 36a-x during operation to optimize, enhance, compensate and/or adjust the reference current. For example, the reference current provided to data sensing circuitry 50 may be adjusted during operation of the device to address and/or compensate for variations in operating conditions (for example, to compensate for changes in temperature or response time parameters or characteristics).

Further, in yet another embodiment, the control data for one or more of reference current generator circuits 36a-x may be fine-tuned to enhance the performance/operation. In this regard, after (or during) the performance of an initialization or re-initialization process, the device may implement fine adjustments to the predetermined, preset or pre-programmed control data. The adjustments to the control data may be accomplished using any techniques; notably, all techniques, whether now known or later developed, are intended to be within the scope of the present inventions. For example, in those embodiments where control circuitry 62 programs or re-programs one, some or all of the reference current generator circuits 36a-x, control circuitry 62 may implement a successive approximation approach to determine control data that, in conjunction with the reference cell banks of reference current generator circuits 36a-x, and provide an optimized, enhanced, compensated and/or adjusted reference current. In this embodiment, control circuitry 62 may store the control data in successive approximation registers.

Again, as mentioned above, in one aspect of the inventions, an improved reference positioning takes sub-micron matching characteristics into account by shifting the reference level of electrical characteristic toward the lower magnitude level to provide $\Delta_{1-Ref} = \Delta_{Ref-0}$ notwithstanding $\alpha \neq 0$.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, it may be advantageous to determine an appropriate, optimum and/or enhanced reference current to be output or provided by one or more (but less than all of) reference current generator circuit 36a-x and provide the control data that is representative of the appropriate, optimum and/or enhanced reference current to other reference current generator circuit 36. For example, with reference to FIGS. 11A-E, an appropriate reference current control word may be determined for reference current generator circuit 36a and provided to reference current generator circuits 36 (for example, neighboring reference current generator circuit 36b). In this regard, the reference cell banks 58a and 58b may be the same general vicinity (for example, neighboring) such that banks 58a and 58b are provided by the same or the substantially same control word. In this way, a considerable amount of calibration and/or adjustment routine may be eliminated and/or avoid.

Moreover, in another embodiment, control data may be determined for one, some or all reference cell banks 58a-58x using, for example, any of the techniques described herein, and thereafter intermittently and/or periodically "tuned" or "tweaked" to account or compensate for changes in the performance of the device (for example, changes due to changes in temperature). As such, in one embodiment, at start-up, initialization or re-initialization, control circuitry 62 may determine control data that, in conjunction with one or more reference cell banks 58 and provide a suitable, predetermined, optimum and/or enhanced reference current 48, as described using any of the techniques above. Thereafter, the reference current may be adjusted during operation of the device by determining a relative adjustment to that "initial" control data (determined during, for example, at start-up/power-up and/or an initialization sequence).

The relative adjustment(s) may be determined (in any manner described herein or any manner now known or later developed) by examining one or more of reference cell banks 58 of one or more of reference current generator circuit 36a-x (for example, one or more reference cell banks in a sub array of memory cells and/or memory or sense bank). After determining the relative adjustment(s), control circuitry 62 may implement the change to the control data for other or all of the reference cell banks 58 of reference current generator circuits 36a-x (even those reference current generator circuits 36a-x that were not directly "analyzed" by control circuitry 62). In this way, changes, modifications and/or programming of the reference currents 48a-x may be accomplished more quickly so that normal operation of the device is not affected. Indeed, intermittently and/or periodically "tuning" or "tweaking" to compensate for changes in the performance of the device may be performed in a manner similar to refresh operation of a DRAM so that there is little to no impact on the normal operation of the device.

It should be noted that control circuitry 62 may include a plurality of control circuits or circuitry. One or more control circuits or circuitry may be associated with one or more sense amplifiers, memory or sense amplifier banks and/or arrays. In this way, calibration, programming and/or adjustment of the reference cell banks 58 may be performed more quickly as well as more often (without impacting the performance of the device).

As mentioned above, the reference current "repositioning" may be implemented in many different and diverse reference current generation techniques and embodiments (whether analog and/or digital techniques). For example, the present inventions may be employed in the read circuitry, architecture and techniques described and illustrated in U.S. patent application Ser. No. 10/840,902, which was filed by Portmann et al. on May 7, 2004, and entitled "Reference Current Generator, and Method of Programming, Adjusting and/or Operating Same" (now U.S. Pat. No. 6,912,150). In this regard, the read circuitry and techniques of the '902 application may include a "repositioned" reference current whereby one data state includes a greater "weight" than another state. For the sake of brevity, those discussions will not be repeated; rather those discussions (text and illustrations) are incorporated by reference herein in its entirety.

Notably, the present inventions may be implemented in conjunction with any memory cell technology, whether now known or later developed. For example, the memory cells may include one or more electrically floating gate transistors, one transistor-one capacitor architecture, electrically floating gate transistors, JFETS, or any other memory/transistor technology whether now known or later developed. All such memory technologies are intended to fall within the scope of the present inventions.

Further, the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

As mentioned above, the memory cells of the memory cell array may include at least one electrically floating body transistor which stores an electrical charge in the electrically floating body region of the transistor. Where an electrically floating body transistor is implemented, it may be programmed (written to), controlled and/or read using the techniques of the present inventions. Moreover, it may employ any electrically floating body memory cell, and/or memory cell array architecture, layout, structure and/or configuration employing such electrically floating body memory cells. In this regard, an electrically floating body transistor, may be implemented in the memory cell, architecture, layout, structure and/or configuration described and illustrated in the following non-provisional U.S. patent applications:

(1) application Ser. No. 10/450,238, which was filed by Fazan et al. on Jun. 10, 2003 and entitled "Semiconductor Device" (now U.S. Pat. No. 6,969,662);

(2) application Ser. No. 10/487,157, which was filed by Fazan et al. on Feb. 18, 2004 and entitled "Semiconductor Device" (U.S. Patent Application Publication No. 2004/0238890);

(3) application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. 2005/0013163);

(4) application Ser. No. 10/840,009, which was filed by Ferrant et al. on May 6, 2004 and entitled "Semiconductor Memory Device and Method of Operating Same" (U.S. Patent Application Publication No. 2004/0228168);

(5) application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (U.S. Patent Application Publication No. 2005/0063224);

(6) application Ser. No. 11/509,188, which was filed by Okhonin et al. on Aug. 24, 2006 and entitled "Memory Cell and Memory Cell Array Having an Electrically Floating Body Transistor, and Methods of Operating Same";

The entire contents of these six (6) U.S. non-provisional patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

Notably, the memory cells may be controlled (for example, programmed or read) using any of the control circuitry described and illustrated in the above-referenced six (6) U.S. patent applications. For the sake of brevity, those discussions will not be repeated; such control circuitry is incorporated herein by reference. Indeed, all memory cell selection and control circuitry for programming, reading, controlling and/or operating memory cells including electrically floating body transistors, whether now known or later developed, are intended to fall within the scope of the present inventions.

For example, the data stored in memory cells 12 of DRAM array/device 10 may be read using many well known circuitry and techniques, including those described in the above-referenced six (6) non-provisional U.S. patent applications. Further, as mentioned above, the present inventions may also employ the read circuitry and techniques described and illustrated in U.S. patent application Ser. No. 11/299,590, which was filed by Waller et al. on May 7, 2004, and entitled "Sense Amplifier Circuitry and Architecture to Write Data into and/or Read from Memory Cells" (U.S. Patent Application Publication No. 2006/0126374).

Moreover, a sense amplifier (not illustrated herein detail) may be employed to read the data stored in memory cells 12. The sense amplifier may sense the data state stored in memory cell 12 using voltage or current sensing techniques. In the context of a current sense amplifier, the current sense amplifier may compare the memory cell current to the reference current, for example, the current of a reference cells as illustrated above in the exemplary embodiments. From that comparison, it may be determined whether memory cell 12 contained a logic high (relatively more majority carries 34 contained within body region 18) or logic low data state (relatively less majority carries 28 contained within body region 18). Such sensing circuitry and configurations thereof are well known in the art.

Notably, where a reference voltage is employed by sensing circuitry 50, reference current 48 may be translated and/or converted to a reference voltage using well known techniques. Such a reference voltage configuration is intended to fall within the scope of the present inventions.

Figure 12A:
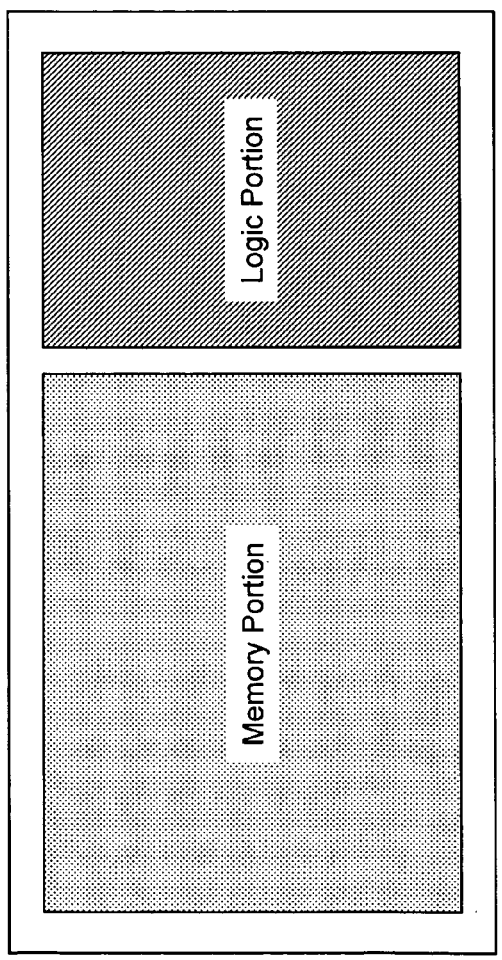
Figure 12B:
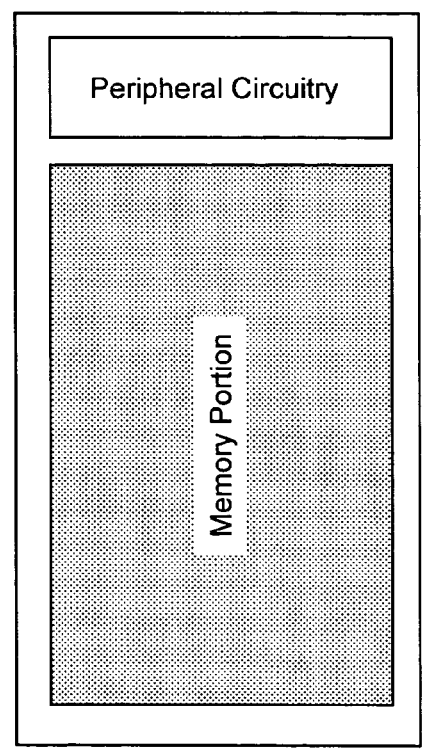

The reference current generator 36 of the present inventions may be implemented in an integrated circuit device having a memory portion and a logic portion (see, for example, FIG. 12A), or an integrated circuit device that is primarily a memory device (see, for example, FIG. 12B). Indeed, the present inventions may be implemented in any device having one or more memory cells 12 (having electrically floating body transistors) and/or memory cell arrays 10.

The electrically floating memory cells, transistors and/or memory array(s) may be fabricated using well known techniques and/or materials. Indeed, any fabrication technique and/or material, whether now known or later developed, may be employed to fabricate the electrically floating memory cells, transistors and/or memory array(s). For example, the present inventions may employ silicon, germanium, silicon/germanium, gallium arsenide or any other semiconductor material (whether bulk-type or SOI) in which transistors may be formed. As such, the electrically floating memory cells may be disposed on or in (collectively "on") SOI-type substrate or a bulk-type substrate.

Indeed, the electrically floating transistors, memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481 (U.S. Patent Application Publication No. 2005/0017240), provisional patent application entitled "One Transistor Memory Cell having Mechanically Strained Electrically Floating Body Region, and Method of Operating Same", which was filed on Oct. 19, 2005, Ser. No. 60/728,060, by Bassin, and/or provisional patent application entitled "Memory Cell, Array and Device, and Method of Operating Same", which was filed on Oct. 19, 2005, Ser. No. 60/728,061, by Okhonin et al. (hereinafter collectively "Integrated Circuit Device Patent Applications"). The contents of the Integrated Circuit Device Patent Applications are hereby incorporated by reference herein.

In another aspect, the present inventions are directed to techniques for programming, reading, controlling and/or operating a semiconductor memory cell, array, architecture and device including electrically floating body transistors, having, for example, fully depleted (FD), surrounding-gate, double-gate, triple-gate and/or FinFET characteristics, in which electrical charge is stored in the body of the transistor. The present inventions are also directed to semiconductor memory cell, array, architecture and device that implement circuitry to implement such reading, controlling and/or operating techniques. The programming/reading technique may employ any of the techniques described and/or illustrated herein.

Further, memory array(s) 10 may be comprised of N-channel, P-channel and/or both types of transistors, as well as partially depleted and/or fully depleted type transistors. In addition, although certain circuitry illustrated herein is indicated as P-channel or N-channel type transistors, the other type of transistor may be employed. For example, reference cells 42 may include P-channel type transistors, or reference current driver 46 may include an N-channel type transistor.

Further, reference current generator circuit 36 may include partially and/or fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, application Ser. No. 10/487,157, which was filed by Fazan et al. on Feb. 18, 2004 and entitled "Semiconductor Device" (U.S. Patent Application Publication No. 2004/0238890)). All such techniques, whether now known or later developed, are intended to fall within the scope of the present inventions.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable.

As mentioned above, the memory arrays may be comprised of N-channel, P-channel and/or both types of transistors. Indeed, circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells 12 in the memory array(s), suitable write and read voltages (for example, negative voltages) are well known to those skilled in the art in light of this disclosure. Accordingly, for sake of brevity, these discussions will not be repeated.

Figure 13:
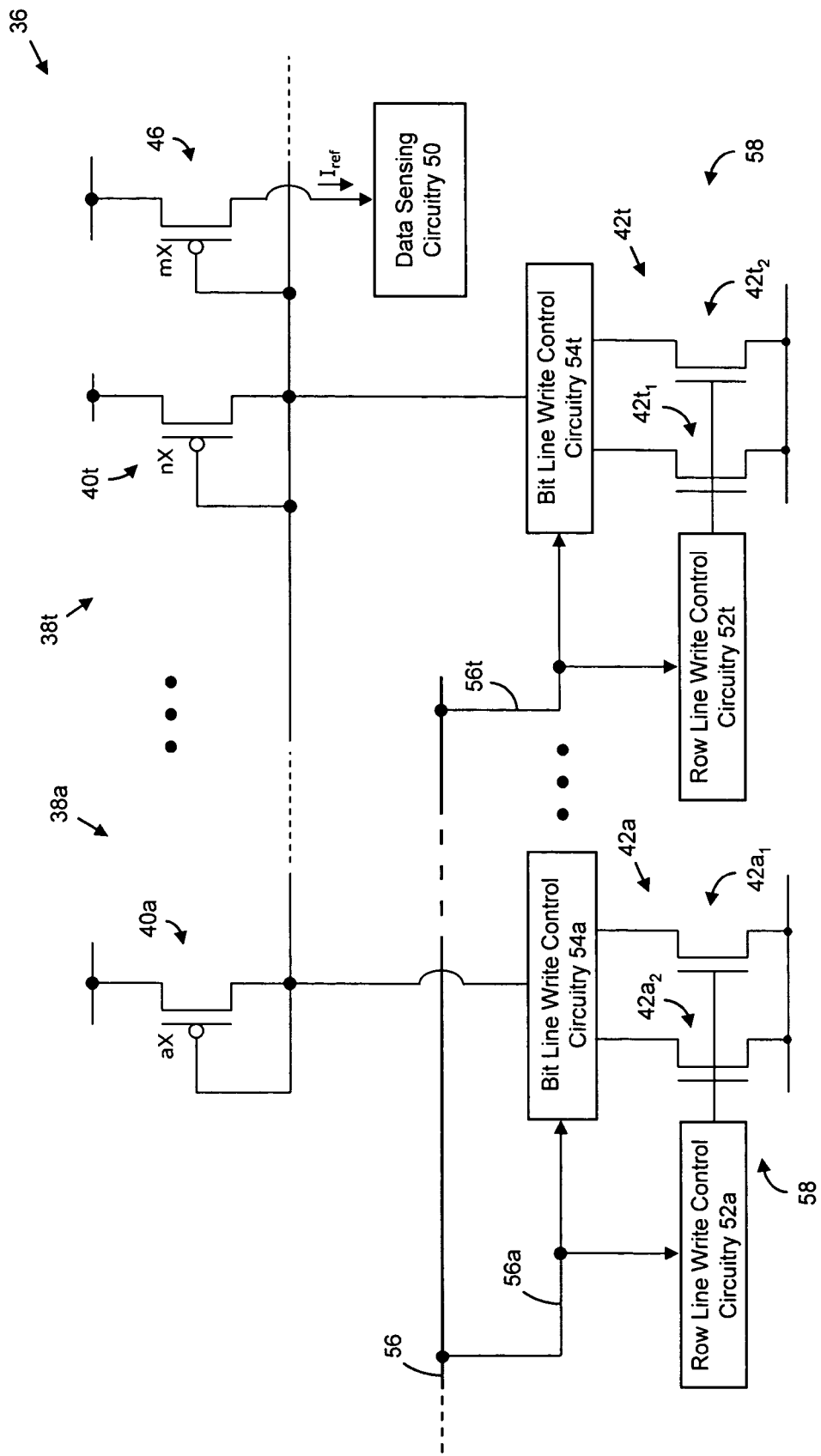
FIGS. 13 and 14A are schematic representations of exemplary embodiments of reference current generation circuitry having a plurality of current drivers having different device geometries, according to an exemplary embodiment of an aspect of the present inventions.

In another embodiment, reference network 38 may include current driver 40a having a device geometry (for example, gate width and/or gate length) of "a" which is different from the device geometry (for example, gate width and/or gate length) of one or more other current drivers 40 of reference network 38. (See, for example, FIG. 13). The different device geometries of current drivers 40a-40t provide additional flexibility to generate, obtain and/or provide a desired, predetermined and/or suitable reference current 48. In this embodiment, a desired, predetermined and/or suitable weighting of a given reference network 38 may be determined using a predetermined device geometries of current drivers 40a-40t.

Figure 14A:
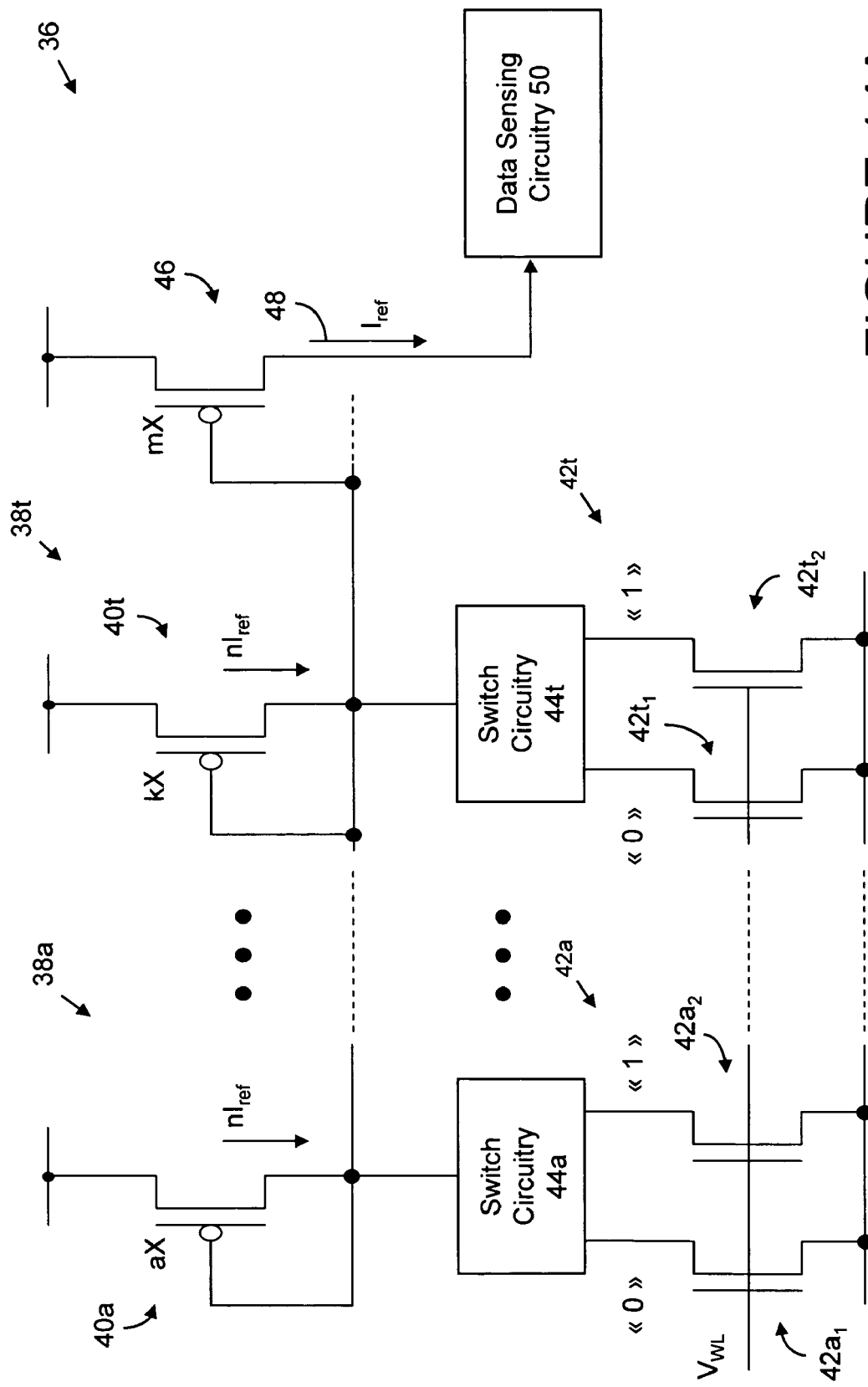

Notably, the embodiment of FIG. 6 may also employ current drivers 40 having different device geometries (for example, gate width and/or gate lengths). In this regard, current driver 40a may include a device geometry (for example, gate width) of "a" which is different from the device geometry (for example, gate width) of one or more other current drivers 40t (which includes a geometry of "k"). (See, for example, FIG. 14A). Again, as mentioned above, in this embodiment, the different device geometries of current drivers 40a-t provide additional flexibility to generate, obtain and/or provide a desired, predetermined and/or suitable reference current 48. As such, a desired, predetermined and/or suitable weighting of a given reference network 38 may be determined using a predetermined geometry(ies) of current drivers 40a-40t.

Figure 14B:
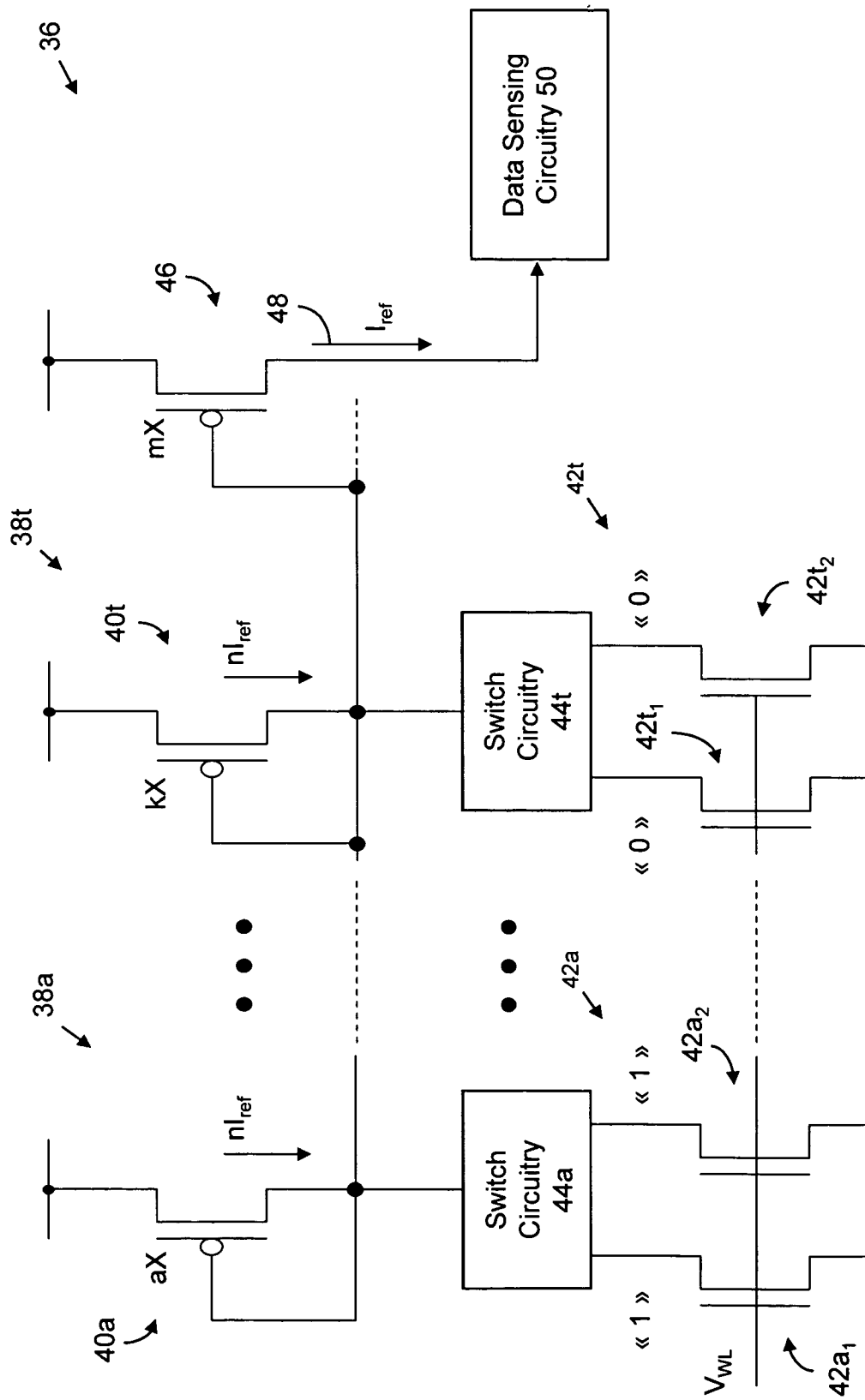
FIGS. 14B and 14C are schematic representations of exemplary embodiments of reference current generation circuitry including a plurality of pairs of reference cells, wherein (among other things) at least one pair of reference cells is programmed and/or controlled to store the same logic state, according to an exemplary embodiment of an aspect of the present inventions.
Figure 14C:
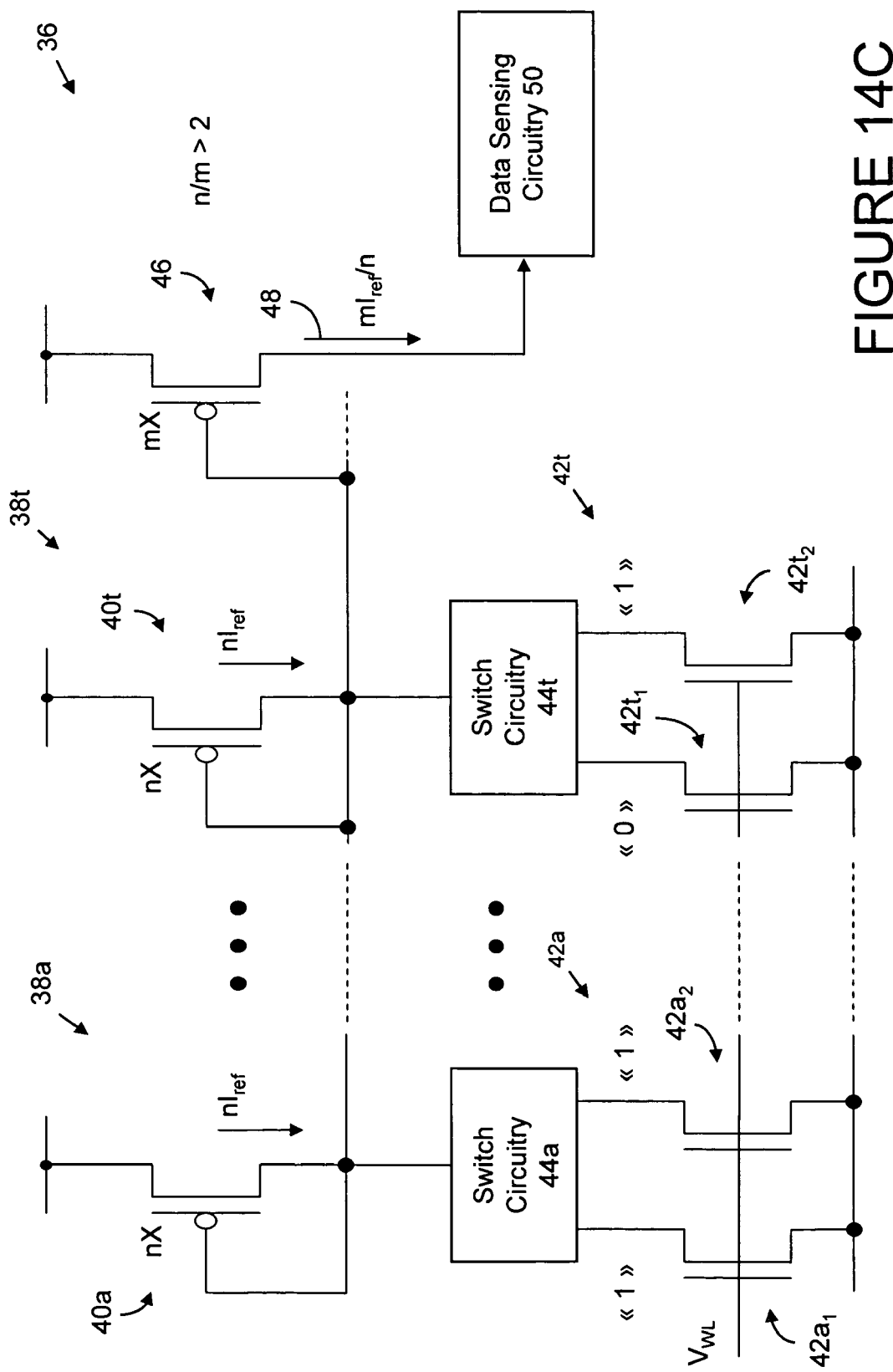

As mentioned above, each of the aspects of the present inventions, and/or embodiments thereof, may be employed alone or in combination with one or more of such aspects and/or embodiments (for example, both reference cells 42 of reference cell circuits 42a-t in the embodiment illustrated in FIG. 6 may be programmed to the same data state—as discussed above in connection with the embodiment of FIG. 8). (See, FIGS. 14B and 14C). For the sake of brevity, those permutations and combinations will not be discussed separately herein. As such, the present inventions are neither limited to any single aspect (nor embodiment thereof), nor to any combinations and/or permutations of such aspects and/or embodiments.

Moreover, the above embodiments of the present inventions are merely exemplary embodiments. They are not intended to be exhaustive or to limit the inventions to the precise forms, techniques, materials and/or configurations disclosed. It is to be understood that other embodiments may be utilized and operational changes may be made without departing from the scope of the present inventions. As such, the foregoing description of the exemplary embodiments of the inventions has been presented for the purposes of illustration and description. Many modifications and variations are possible in light of the above teaching. It is intended that the scope of the inventions not be limited solely to the description above.

It should be further noted that the term "circuit" may mean, among other things, a single component (for example, electrical/electronic and/or microelectromechanical) or a multiplicity of components (whether in integrated circuit form or otherwise), which are active and/or passive, and which are coupled together to provide or perform a desired operation. The term "circuitry" may mean, among other things, a circuit (whether integrated or otherwise) and/or a group of circuits. The term "data" may mean, among other things, a current or voltage signal(s) whether in an analog or a digital form.

What is claimed is:

1. A reference current generation circuit to generate a reference current for data sensing circuitry, the reference current generation circuit comprising:
   a plurality of reference networks, wherein each reference network includes:
   a current driver including a transistor having an output which is coupled to a signal line; and
   a reference cell network wherein the reference cell network includes a plurality of reference cells, and wherein each reference cell is programmed to one of a plurality of data states, and wherein:
   (i) a majority of the reference cells of at least one of the reference cell networks are programmed to a second data state and (ii) a minority of the reference cells of the at least one of the reference cell network is/are programmed to a first data state; and an equal number of the reference cells of at least one of the reference cell networks are programmed to a first data state and to a second data state; and a reference current driver including a transistor which is coupled to the plurality of reference networks via the signal line to generate the reference current.

2. The reference current generation circuit of claim 1 wherein a majority of the reference cells of a plurality of the reference cell networks are programmed to the second data state and a minority of the reference cells of the at least one of the reference cell network is/are programmed to the first data state.

3. The reference current generation circuit of claim 1 wherein all of the reference cells of the at least one reference cell network are programmed to the second data state.

4. The reference current generation circuit of claim 1 further including control data signal lines, coupled to the at least one reference cell network, to program the reference cells of the at least one reference cell network.

5. The reference current generation circuit of claim 4 further including memory circuitry, coupled to the control data signal lines, to store control data which is applied to the control data signal lines to program the reference cells of the at least one reference cell network.

6. The reference current generation circuit of claim 5 wherein the memory circuitry includes one or more (i) registers and/or (ii) fuses or anti-fuses.

7. The reference current generation circuit of claim 4 further including control circuitry, coupled to the control data signal lines, to determine the control data which is applied to the control data signal lines to program the reference cells of the at least one reference cell network.

8. The reference current generation circuit of claim 4 wherein the control data is fixed.

9. The reference current generation circuit of claim 4 wherein the control data is applied to the control data signal lines to program the reference cells of the at least one reference cell network during start-up and/or initialization.

10. The reference current generation circuit of claim 1 wherein the transistor of the current driver of each reference network and the transistor of each reference current driver include device geometries and wherein the device geometry of the transistor of the current driver is more than twice the device geometry of the transistor of the reference current driver.

11. The reference current generation circuit of claim 1 wherein the transistor of each current driver of each reference network includes a device geometry and wherein the device geometry of the transistor of each current driver is at least substantially the same.

12. The reference current generation circuit of claim 1 wherein the transistor of each current driver of each reference network includes a device geometry and wherein the device geometry of the transistor of the current driver of at least one reference network is substantially different from a device geometry of the transistors of a plurality of current drivers of other reference networks.

13. A reference current generation circuit to generate a reference current for data sensing circuitry, the reference current generation circuit comprising:

a plurality of reference networks, wherein each reference network includes:

a current driver having an output coupled to a signal line; and a reference cell network wherein the reference cell network includes a plurality of reference cells, and wherein each reference cell is programmed in (i) a first data state which corresponds to a first charge in the body region of the transistor of the reference cell, or (ii) a second data state which corresponds to a second charge in the body region of the transistor of the reference cell;

a majority of the reference cells of at least one of the reference cell networks are programmed to a second data state and a minority of the reference cells of the at least one of the reference cell network is/are programmed to a first data state; and an equal number of the reference cells of at least one of the reference cell networks are programmed to a first data state and to a second data state; and a reference current driver coupled to the plurality of reference networks via the signal line to generate the reference current.

14. The reference current generation circuit of claim 13 wherein a majority of the reference cells of a plurality of the reference cell networks are programmed to the second data state and a minority of the reference cells of the at least one of the reference cell network is/are programmed to the first data state.

15. The reference current generation circuit of claim 13 wherein all of the reference cells of the at least one reference cell network are programmed to the second data state.

16. The reference current generation circuit of claim 13 further including memory circuitry to store control data which is applied to at least one reference cell network to program the reference cells of at least one reference cell network.

17. The reference current generation circuit of claim 16 wherein the memory circuitry includes one or more (i) registers and/or (ii) fuses or anti-fuses.

18. The reference current generation circuit of claim 13 further including control circuitry to determine the control data which is applied to at least one reference cell network to program the reference cells of at least one reference cell network.

19. The reference current generation circuit of claim 13 wherein one or more of the reference cells are programmed during initialization and/or operation.

20. The reference current generation circuit of claim 13 wherein the data state of the reference cells is fixed.

21. A reference current generation circuit to generate a reference current for data sensing circuitry, the reference current generation circuit comprising:

a plurality of reference networks, wherein each reference network includes:

a current driver including a transistor having an output which is coupled to a signal line; and a reference cell network wherein the reference cell network includes a plurality of reference cells, and wherein each reference cell is programmed to one of a plurality of data states and includes a transistor having an electrically floating body region, and wherein:

each transistor of each reference cell is programmed in (i) a first data state which corresponds to a first charge in the body region of the transistor of the reference cell, or (ii) a second data state which corresponds to a second charge in the body region of the transistor of the reference cell; and each transistor of a majority of the reference cells of at least one of the reference cell networks is programmed to the second data state and each transistor of a minority of the reference cells of the at least one of the reference cell network is/are programmed to the first data state; and a reference current driver including a transistor which is coupled to the plurality of reference networks via the signal line to generate the reference current for the data sensing circuitry.

22. The reference current generation circuit of claim 21 wherein in a plurality of reference cell networks an equal number of the transistors of the reference cells are programmed to a first data state and to a second data state.

23. The reference current generation circuit of claim 21 wherein the transistors of all of the reference cells of the at least one reference cell network are programmed to a second data state.

24. The reference current generation circuit of claim 21 further including memory circuitry to store control data which is applied to at least one reference cell network to program the transistor of each reference cell of at least one reference cell network.

25. The reference current generation circuit of claim 21 further including control circuitry to determine the control data which is applied to at least one reference cell network to program the transistor of each reference cell of at least one reference cell network.

26. The reference current generation circuit of claim 21 wherein the transistors of one or more of the reference cells are programmed during initialization.

27. The reference current generation circuit of claim 21 wherein the data state of the transistor of each reference cell of the plurality of reference cell networks is fixed.

28. The reference current generation circuit of claim 21 wherein the transistor of the current driver of each reference network and the transistor of each reference current driver include device geometries and wherein the device geometry of the transistor of the current driver is more than twice the device geometry of the transistor of the reference current driver.

29. The reference current generation circuit of claim 21 wherein the transistor of each current driver includes a device geometry and wherein the device geometry of the transistor of each current driver is at least substantially the same.

30. The reference current generation circuit of claim 21 wherein the transistor of each current driver of each reference network includes a device geometry and wherein the device geometry of the transistor of the current driver of at least one reference network is substantially different from a device geometry of the transistor of the current driver of each of a plurality of the reference networks.

31. A reference current generation circuit to generate a reference current for data sensing circuitry, the reference current generation circuit comprising:

a plurality of reference networks, wherein each reference network includes:
   a current driver including a transistor having an output which is coupled to a signal line, wherein the transistor of each current driver includes a device geometry; and
   a reference cell network wherein the reference cell network includes a plurality of reference cells, and wherein each reference cell is programmed to one of a plurality of data states and includes a transistor having an electrically floating body region, and wherein:
      each transistor of each reference cell is programmed in (i) a first data state which corresponds to a first charge in the body region of the transistor of the reference cell, or (ii) a second data state which corresponds to a second charge in the body region of the transistor of the reference cell; and a reference current driver including a transistor which is coupled to the plurality of reference networks via the signal line to generate the reference current for the data sensing circuitry;

wherein:
   the transistor of the reference current driver includes a device geometry;
   the transistor of each current driver of each reference network includes a device geometry; and
   the device geometry of the transistor of each current driver is more than twice the device geometry of the transistor of the reference current driver.

32. The reference current generation circuit of claim 31 wherein the device geometry of each transistor of each current driver of each reference network is at least substantially the same.

33. The reference current generation circuit of claim 31 wherein each transistor of a majority of the reference cells of at least one of the reference cell network is programmed to the second data state and each transistor of a minority of the reference cells of the reference cell network is/are programmed to the first data state.

34. The reference current generation circuit of claim 31 wherein in a plurality of reference cell networks an equal number of the transistors of the reference cells are programmed to a first data state and to a second data state.

* * * * *